(12) United States Patent
Jung et al.

(10) Patent No.: US 12,261,245 B2
(45) Date of Patent: *Mar. 25, 2025

(54) DISPLAY DEVICE

(71) Applicant: Samsung Display Co., LTD., Yongin-si (KR)

(72) Inventors: Jae Hoon Jung, Seoul (KR); Won Ho Lee, Suwon-si (KR); Hyun Deok Im, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/394,110

(22) Filed: Dec. 22, 2023

(65) Prior Publication Data

US 2024/0178347 A1 May 30, 2024

Related U.S. Application Data

(63) Continuation of application No. 17/284,349, filed as application No. PCT/KR2019/004871 on Apr. 23, 2019, now Pat. No. 11,888,092.

(30) Foreign Application Priority Data

Oct. 10, 2018 (KR) .................. 10-2018-0120437

(51) Int. Cl.
*H01L 33/38* (2010.01)
*H01L 33/00* (2010.01)

(52) U.S. Cl.
CPC .......... *H01L 33/382* (2013.01); *H01L 33/005* (2013.01)

(58) Field of Classification Search
CPC ............................. H01L 33/382; H01L 33/005
(Continued)

(56) References Cited

U.S. PATENT DOCUMENTS 11,888,092 B2 * 1/2024 Jung ..................... H01L 33/62
2011/0186876 A1 * 8/2011 Suzuki ..................... B41J 2/45
257/89

(Continued)

FOREIGN PATENT DOCUMENTS

EP      3 270 424       1/2018
JP      2008-16832      1/2008
(Continued)

OTHER PUBLICATIONS

International Search Report, with English translation, corresponding to International Application No. PCT/KR2019/004871 dated Aug. 14, 2019.

(Continued)

*Primary Examiner* — Igwe U Anya
(74) *Attorney, Agent, or Firm* — KILE PARK REED & HOUTTEMAN PLLC

(57) ABSTRACT

A display device includes a first electrode, a second electrode spaced apart from the first electrode and facing the first electrode, a first insulating layer disposed to at least partially cover the first electrode and the second electrode, a second insulating layer disposed on at least a part of the first insulating layer, and a light-emitting element disposed on the second insulating layer between the first electrode and the second electrode, wherein at least a part of a lower surface of the light-emitting element is chemically bonded to the second insulating layer.

15 Claims, 23 Drawing Sheets

(58) Field of Classification Search
USPC .......................................................... 257/79
See application file for complete search history.

(56) References Cited

U.S. PATENT DOCUMENTS

| | | | |
|---|---|---|---|
| 2018/0019377 A1 | 1/2018 | Kim et al. | |
| 2018/0019426 A1 | 1/2018 | Im et al. | |
| 2018/0175009 A1 | 6/2018 | Kim et al. | |
| 2019/0251898 A1 | 8/2019 | Cho et al. | |
| 2019/0326474 A1 | 10/2019 | Kim et al. | |
| 2021/0265529 A1 | 8/2021 | Kim et al. | |
| 2021/0327954 A1* | 10/2021 | Cho | H01L 33/38 |

FOREIGN PATENT DOCUMENTS

| | | |
|---|---|---|
| JP | 2012-4535 | 1/2012 |
| KR | 10-2009-0019845 | 2/2009 |
| KR | 10-2012-0122645 | 11/2012 |
| KR | 10-2015-0006798 | 1/2015 |
| KR | 10-2017-0028456 | 3/2017 |
| KR | 10-2018-0009014 | 1/2018 |
| KR | 10-2018-0072909 | 7/2018 |
| WO | WO-2012148231 A2 * 11/2012 ............. H01L 33/20 |

OTHER PUBLICATIONS

Written Opinion, with English translation, corresponding to International Application No. PCT/KR2019/004871, dated Aug. 14, 2019.
Yuzhe Ding et al., "Universal Nanopatternable Interfacial Bonding", Advanced Materials, 2011, pp. 5551-5556, vol. 23.
Extended European Search Report for European Patent Application or Patent No. 19872163.1 dated Jun. 7, 2022.

* cited by examiner

DISPLAY DEVICE

CROSS-REFERENCE TO RELATED APPLICATION(S)

This is a continuation application of U.S. patent application Ser. No. 17/284,349, filed Apr. 9, 2021 (now U.S. Pat. No. 11,888,092), the disclosure of which is incorporated herein by reference in its entirety. U.S. patent application Ser. No. 17/284,349 is a national stage entry of International Application No. PCT/KR2019/004871, filed Apr. 23, 2019, which claims under 35 U.S.C. § 119 (a) and 365 (b) priority to and benefits of Korean Patent Application No. 10-2018-0120437, filed Oct. 10, 2018, in the Korean Intellectual Property Office, the entire contents of which are incorporated herein by reference.

BACKGROUND

1. Technical Field

The disclosure relates to a display device in which an organic pattern formed on surfaces of an electrode may be chemically bonded to light-emitting elements.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and may include a display panel such as an organic light-emitting display panel or a liquid-crystal display panel. Among display devices, a light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

An organic light-emitting diode (OLED) may use an organic material for the fluorescent material of the light-emitting elements. Such a technique may be advantageous in that the fabricating process may be simple and the element may have flexibility. However, organic materials may be vulnerable to high-temperature driving environments and the efficiency of blue light may be relatively low.

On the other hand, in the case of an inorganic light emitting diode, there may be an advantage that it has durability even in high-temperature environments and has higher efficiency of blue light than an organic light emitting diode because it uses an inorganic semiconductor as a fluorescent material. Further, even in the manufacturing process that has been pointed out as a limitation of a conventional inorganic light emitting diode, transcription methods using dielectrophoresis (DEP) have been developed. Therefore, research continues on inorganic light emitting diodes having higher durability and efficiency than organic light emitting diodes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that may include an insulating layer for fixing the positions of light-emitting elements by forming bonds between the insulating layer and the light-emitting elements, thereby improving the alignment of the light-emitting elements.

It should be noted that aspects of the disclosure are not limited to the above-mentioned aspect. Other aspects will be apparent to those skilled in the art from the following descriptions.

According to an embodiment of the disclosure, a display device may comprise a first electrode, a second electrode spaced apart from the first electrode and facing the first electrode, a first insulating layer disposed to at least partially cover the first electrode and the second electrode, a second insulating layer disposed on at least a part of the first insulating layer, and a light-emitting element disposed on the second insulating layer between the first electrode and the second electrode, wherein at least a part of a lower surface of the light-emitting element may be chemically bonded to the second insulating layer.

The light-emitting element may contact the second insulating layer to form the chemical bond, and an area where the light-emitting element contacts the second insulating layer may comprise a covalent bond area containing the chemical bond between the light-emitting element and the second insulating layer.

The light-emitting element may comprise a rod-like semiconductor core, an insulation film surrounding the semiconductor core, and a binding group coupled to the insulation film. The second insulating layer may comprise a functional group, and the chemical bond between the light-emitting element and the second insulating layer may be formed by a chemical reaction between the bonding group and the functional group.

The binding group may comprise a main chain, a linker coupled to the main chain and connecting the main chain with the light-emitting element, and another functional group substituted on the main chain, and the another functional group may form a covalent bond with the functional group.

The second insulating layer may comprise at least one insulating pattern extended in a direction, and the at least one insulating pattern may be spaced apart from one another in another direction intersecting the direction.

The second insulating layer may comprise a first insulating pattern partially overlapping the first electrode, and a second insulating pattern partially overlapping the second electrode.

The first insulating pattern may overlap side portions of the first electrode and does not overlap between the side portions of the first electrode, and the second insulating pattern may overlap side portions of the second electrode and may not overlap between the side portions of the second electrode.

The first insulating pattern may overlap a side portion of the first electrode that faces the second electrode, and the light-emitting element may be disposed between the side portion of the first electrode and a side portion of the second electrode that faces the first electrode.

The covalent bond area may be formed on each of the first insulating pattern and the second insulating pattern and be located adjacent to ends of the lower surface of the light-emitting element.

The second insulating layer may comprise a third insulating pattern disposed between the first electrode and the second electrode spaced apart from each other.

The covalent bond area may be disposed on the third insulating pattern and may be located at a center of the lower surface of the light-emitting element.

The second insulating layer may overlap a space between the first electrode and the second electrode and be disposed to partially cover the first electrode and the second electrode.

The second insulating layer may cover end portions of the second electrode and an end portion of the first electrode and face the second electrode.

The first electrode may comprise a first electrode stem extended in a first direction, and at least one first electrode branch branching off from the first electrode stem and extended in a second direction intersecting the first direction, and the second electrode may comprise a second electrode stem extended in the first direction and spaced apart from the first electrode stem, and a second electrode branch branching off from the second electrode stem and extending in the second direction, the second electrode branch being spaced apart from the first electrode branch.

The second insulating layer may be disposed to partially cover the at least one first electrode branch and the second electrode branch, and the light-emitting element may contact the second insulating layer between the at least one first electrode branch and the second electrode branch.

According to an embodiment of the disclosure, a display device may comprise at least one first bank and a second bank disposed on a substrate and spaced apart from each other, wherein at least a part of each of the at least one first bank and the second bank protrudes toward an upper surface of the substrate, a first electrode that covers the at least one first bank and a second electrode that covers the second bank, a first insulating layer that covers the first electrode, the second electrode, and a space between the first electrode and the second electrode, a second insulating layer disposed on at least a part of the first insulating layer, and a light-emitting element disposed on the second insulating layer between the first electrode and the second electrode. At least a part of a lower surface of the light-emitting element may be chemically bonded to the second insulating layer, the light-emitting element may comprise a rod-like semiconductor core, an insulation film surrounding the semiconductor core, and a binding group coupled to the insulation film, and the second insulating layer comprises a functional group, and the chemical bond between the light-emitting element and the second insulating layer may be formed by a chemical reaction between the binding group and the functional group.

The binding group may comprise a main chain, a linker coupled to the main chain and connecting the main chain with the light-emitting element, and another functional group substituted on the main chain, the another functional group may form a covalent bond with the functional group.

The light-emitting element may contact the second insulating layer to form the chemical bond, and an area where the light-emitting element contacts the second insulating layer may comprise a covalent bond area containing a covalent bond between the functional group and the another functional group.

The second insulating layer may be disposed in a space between the first electrode and the second electrode, and the covalent bond area may be located at a center of a lower surface of the light-emitting element.

The second insulating layer may be extended to partially overlap the first electrode and the second electrode and be disposed on side surfaces of the first bank and the second bank, and the covalent bond area may be located adjacent to ends of the lower surface of the light-emitting element.

The above and other features and advantages will become more apparent by describing in detail embodiments thereof with reference to the attached drawings.

According to an embodiment of the disclosure, a display device may include an insulating layer capable of forming a covalent bond with an outer surface of each of light-emitting elements. The light-emitting elements can be fixed on the insulating layer, so that it may be possible to reduce a change in the alignment of the light-emitting elements during the process of fabricating the display device. Accordingly, the alignment of the light-emitting elements can be improved, and the display device can improve the emission reliability of each of the pixels.

The effects of the disclosure are not limited to the above-described effects, and other unmentioned effects will be clearly understood to those skilled in the art from the description of claims.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on another layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

"About", "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
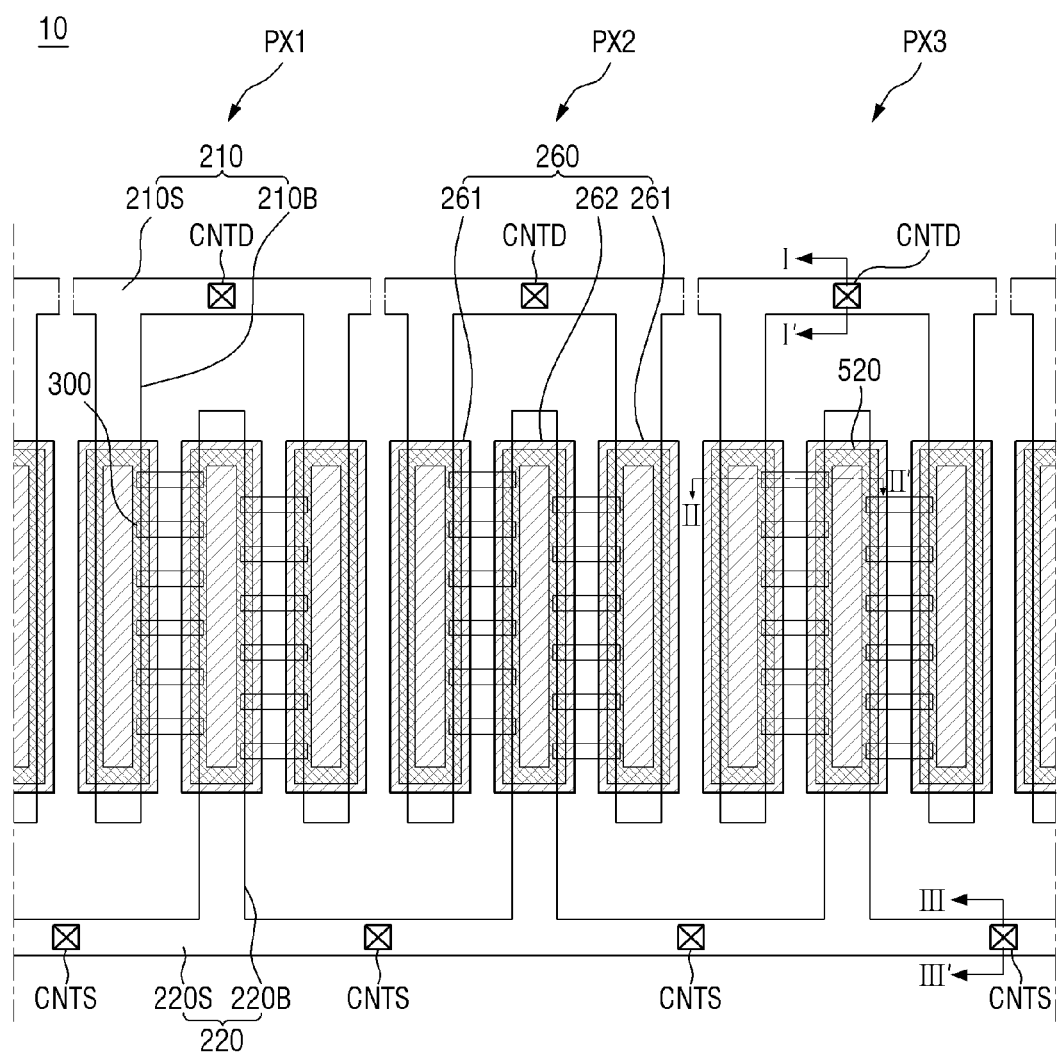
FIG. 1 is a schematic plan view of a display device according to an embodiment of the disclosure.

FIG. 1 is a schematic plan view of a display device according to an embodiment of the disclosure.

The display device 10 may include one or more regions defined as pixels PX. The pixels PX may be disposed on a display part of the display device 10 so that light of a particular wavelength band can exit the display device 10. Although three pixels PX1, PX2 and PX3 are depicted in FIG. 1 by way of example, it is to be understood that the display device 10 may include more pixels. Although the cross-sectional view of FIG. 1 shows the pixels PX arranged only in one direction, i.e., a first direction D1, the pixels PX may be arranged in a second direction D2 intersecting with the first direction D1 as well. The pixels PX shown in FIG. 1 may be divided into several pixels, each of which may form a pixel PX. The pixels may not be necessarily arranged in parallel in the first direction DR1 as shown in FIG. 1 but may be arranged in a variety of ways, e.g., in the vertical direction (or the second direction D2), in a zigzag pattern, etc.

Although not shown in the drawings, the display device 10 may include an emission area in which light-emitting elements 300 may be disposed to emit lights of certain colors, and a non-emission area that may be defined as a region other than the emission area. The non-emission area may be covered by some elements so that it may not be visible from outside the display device 10. In the non-emission area, a variety of elements for driving the light-emitting elements 300 in the emission area may be disposed. For example, in the non-emission area, lines for applying electrical signals to the emission area, circuits, drivers, etc. may be disposed. It is, however, to be understood that the disclosure is not limited thereto.

The pixels PX may include one or more light-emitting elements 300 that emit light of particular wavelength bands to represent colors. The light emitted from the light-emitting elements 300 can be seen from outside the display device 10 via the emission area. In an embodiment, pixels PX that represent different colors may include light-emitting elements 300 that emit lights of different colors. For example, a first pixel PX1 for representing red may include light-emitting elements 300 for emitting red light, a second pixel PX2 for representing green may include light-emitting elements 300 for emitting green light, and a third pixel PX3 for representing blue may include light-emitting elements 300 for emitting blue light. It is, however, to be understood that the disclosure is not limited thereto. In some implementations, the pixels representing different colors may include the light-emitting elements 300 emitting the same color (e.g., blue), and wavelength conversion layers or color filters may be disposed on in the optical paths to represent colors of the pixels. In some implementations, adjacent pixels PX may emit light of the same color.

Referring to FIG. 1, the display device 10 may include electrodes 210 and 220 and light-emitting elements 300. At least some of the electrodes 210 and 220 may be disposed in each of the pixels PX and may be electrically connected to the light-emitting elements 300 to apply electrical signals so that the light-emitting elements 300 can represent particular colors.

At least some of the electrodes 210 and 220 may be utilized to form an electric field within the pixels PX to align the light-emitting elements 300. Specifically, in case that the light-emitting elements 300 may be aligned in the pixels PX, it may be necessary to accurately align the light-emitting elements 300 between the electrodes 210 and 220 in the pixels PX. For example, the light-emitting elements 300 may be aligned using the dielectrophoresis as follows. A solution containing the light-emitting elements 300 may be applied onto the display device 10, and an AC electric power may be applied to form capacitance by an electric field, so that a dielectrophoresis force can be applied to the light-emitting elements 300 to align the light-emitting elements 300.

During the process of drying the solution containing the light-emitting elements 300 after the light-emitting elements 300 have been aligned, the alignment of the light-emitting elements 300 may be changed. In case that the solution may be dried, the solution molecules may not uniformly volatilize over the entire area. As a result, the solution may be volatilized first in a certain area, and a hydrodynamic force may be formed in the solution. Such a hydrodynamic force may be applied to the light-emitting elements 300 to move the positions of the light-emitting elements 300.

In the display device 10 according to an embodiment, each of the light-emitting elements 300 may form a bond with a second insulating layer 520 (see FIG. 2) disposed on the electrodes 210 and 220 or between the electrodes 210 and 220. By doing so, even if a hydrodynamic force may be applied to the light-emitting elements 300 during the process of drying the solution after aligning the light-emitting elements 300, the positions of the light-emitting elements 300 can be held, thereby improving the alignment of the light-emitting elements 300. A more detailed description thereon will be given later.

The electrodes 210 and 220 may include the first electrode 210 and the second electrode 220. In an embodiment, the first electrode 210 may be disconnected from pixel to pixel PX, while the second electrode 220 may be a common electrode connected across the pixels PX. One of the first electrode 210 and the second electrode 220 may be the anode electrode of each of the light-emitting elements 300, while another may be the cathode electrode of each of the light-emitting elements 300. It is, however, to be understood that the disclosure is not limited thereto.

The first electrode 210 and the second electrode 220 may include electrode stems 210S and 220S extended in the first direction D1, respectively, and one or more electrode branches 210B and 220B branching off from the electrode stems 210S and 220S, respectively, and extended in the second direction D2 intersecting the first direction D1.

Specifically, the first electrode 210 may include a first electrode stem 210S extended in the first direction D1, and at least one first electrode branch 210B branching off from the first electrode stem 210S and extended in the second direction D2. Although not shown in the drawings, an end of the first electrode stem 210S may be connected to a signal application pad, and another end thereof may be extended in the first direction D1 and electrically disconnected from pixel to pixel PX. The signal application pad may be connected to the display device 10 or an external power source to apply an electric signal to the first electrode stem 210S or to apply an AC power to align the light-emitting elements 300.

The first electrode stem 210S of a pixel may be substantially in line with the first electrode stem 210S of another pixel adjacent to the pixel in the same row (e.g., in the first direction D1). In other words, the first electrode stem 210S of a pixel may be terminated between the pixel and an adjacent pixels PX and separated therefrom, and the first electrode stems 210S of the adjacent pixels may be in line with the first electrode stem 210S of the pixel.

The first electrode stem 210S may be formed as a single stem electrode during the fabricating process, and may be cut using a laser or the like after the light-emitting elements 300 have been aligned. Accordingly, the first electrode stem 210S disposed in each of the pixels PX can apply different electric signals to first electrode branches 210B, so that the first electrode branches 210B disposed in each of the pixels PX may be driven individually.

The first electrode branches 210B may branch off from at least a portion of the first electrode stem 210S to be extended in the second direction D2 and may be terminated while being spaced apart from the second electrode stem 220S that may be opposed to the first electrode stem 210S. For example, in the pixels PX, ends of the first electrode branches 210B may be connected to the first electrode stem 210S, and other ends of the first electrode branches 210B may be spaced apart from the second electrode stem 220S. Since the first electrode branches 210B may be connected to the first electrode stem 210S that may be electrically separated from pixel to pixel, different pixels PX may receive different electric signals.

One or more first electrode branches 210B may be disposed in each pixel PX. Although the two first electrode branches 210B may be disposed and the second electrode branch 220B may be disposed therebetween in the example shown in FIG. 1, this is merely illustrative. More than two first electrode branches 210B may be disposed. In case that there may be multiple second electrode branches 220B, the first electrode branches 210B and the second electrode branches 220B may be arranged alternately and spaced apart from each other, such that light-emitting elements 300 may be disposed therebetween. In some embodiments, the second electrode branch 220B may be disposed between the first electrode branches 210B, and each of the pixels PX may have a symmetrical structure with respect to the second electrode branch 220B. It is, however, to be understood that the disclosure is not limited thereto.

The second electrode 220 may include a second electrode stem 220S extended in the first direction D1 and spaced apart from and opposed to the first electrode stem 210S, and at least one second electrode branch 220B branching off from the second electrode stem 220S, extended in the second direction D2 and spaced apart from and facing the first electrode branches 210B. Like the first electrode stem 210S, an end of the second electrode stem 220S may be connected to the signal application pad. It is to be noted that another end of the second electrode stem 220S may be extended across the pixels PX adjacent to one another in the first direction D1. For example, the second electrode stem 220S may be electrically connected between the pixels PX. Accordingly, both ends of the second electrode stem 220S in a pixel may be connected to ends of adjacent pixels on either side, so that the same electrical signal may be applied to the pixels.

The second electrode branch 220B may branch off from at least a portion of the second electrode stem 220S to be extended in the second direction D2 and may be terminated while being spaced apart from the first electrode stem 210S. For example, in a pixel PX, an end of the second electrode branch 220B may be connected to the second electrode stem 220S, and another end of the second electrode branch 220B may be spaced apart from the first electrode stem 210S. Since the second electrode branch 220B may be connected to the second electrode stem 220S that may be electrically connected from pixel to pixel, different pixels PX may receive the same electrical signal.

The second electrode branch 220B may be spaced apart from and face the first electrode branches 210B. Since the first electrode stem 210S and the second electrode stem 220S may be spaced apart from and opposed to each other on opposite sides of the center of each pixel PX, the first electrode branch 210B and the second electrode branch 220B may be extended in the opposite directions. In other words, the first electrode branch 210B may be extended toward a side in the second direction D2 and the second electrode branch 220B may be extended toward the opposite side in the second direction D2, such that they may be disposed on the opposite sides with respect to the center of the pixel PX. It is, however, to be understood that the disclosure is not limited thereto. The first electrode stem 210S and the second electrode stem 220S may be disposed on the same side of the center of the pixel PX and may be spaced apart from each other. The first electrode branch 210B and the second electrode branch 220B branching off from the electrode stems 210S and 220S, respectively, may be extended in the same direction.

Although one second electrode branch 220B may be disposed in each of the pixels PX in the example shown in FIG. 1, this is merely illustrative. Two or more second electrode branches 220B may be disposed.

Light-emitting elements 300 may be aligned between each of the first electrode branches 210B and the second electrode branch 220B. Specifically, at least some of the light-emitting elements 300 may have ends electrically connected to the first electrode branches 210B and other ends electrically connected to the second electrode branch 220B.

The light-emitting elements 300 may be spaced apart from one another in the second direction D2 and may be aligned substantially in parallel with one another. The spacing between the light-emitting elements 300 is not particularly limited herein. In some implementations, some of the light-emitting elements 300 may be disposed close to each other to form a group, and some other of the light-emitting elements 300 may be disposed close to each other to form another group that may be spaced apart from the group. In another embodiment, the light-emitting elements 300 may be arranged such that they may be orientated in a direction with irregular densities.

Although not shown in FIG. 1, a first insulating layer 510 (see FIG. 2) may be disposed to partially cover the first electrode branches 210B, the second electrode branch 220B, and the spaces therebetween. The first insulating layer 510 can protect the electrodes 210 and 220 and insulate the electrodes 210 and 220 from each other so that they may not be in direct contact with each other. The light-emitting elements 300 may be aligned on the first insulating layer 510 disposed in the space between the first electrode branches 210B and the second electrode branch 220B. Accordingly, the first insulating layer 510 can prevent the light-emitting elements 300 from being in direct contact with other elements. A more detailed description on the first insulating layer 510 will be made later.

The second insulating layer 520 may be disposed on the first insulating layer 510. The second insulating layer 520 may be disposed such that it overlaps the electrode branches 210B and 220B on which the light-emitting elements 300 may be aligned or the space therebetween. Accordingly, the second insulating layer 520 may partially overlap the light-emitting elements 300 arranged on the first insulating layer 510. In other words, the light-emitting elements 300 may be aligned between the first electrode branches 210B and the second electrode branch 220B, and may be arranged so that they overlap the second insulating layer 520 at least partially.

The second insulating layer 520 may form a pattern on the first insulating layer 510. For example, the second insulating layer 520 may include at least one insulating pattern extended in the second direction D2, and insulating patterns may be disposed to be spaced apart from each other in the first direction D1. The insulating pattern may overlap the first electrode branches 210B and the second electrode branch 220B. It is, however, to be understood that the disclosure is not limited thereto. The insulating pattern may be disposed only in the space between the first electrode branches 210B and the second electrode branch 220B so that they do not overlap the electrodes.

In the example shown in FIG. 1, the insulating pattern of the second insulating layer 520 covers both side portions of each of the first electrode branches 210B and the second electrode branch 220B in the first direction D1 but does not overlap the central portion of the electrode branches. Accordingly, the second insulating layer 520 may have a shape in which one or more insulating patterns extended in the second direction D2 may be arranged in the first direction D1 in each of the pixels PX.

The ends of the second insulating layer 520 in the second direction D2 may be disposed so that they do not overlap any of the ends of the electrode branches 210B and 220B extended in the second direction D2. The ends of the second insulating layer 520 in the second direction D2 may be terminated while being spaced apart from the electrode stems 210S and 220S.

It is, however, to be noted that the arrangement and structure of the second insulating layer 520 are not limited thereto. As another example, the second insulating layer 520 may be disposed so that it does not overlap the electrodes 210 and 220 or may be disposed to cover only one side of each of the electrode branches 210B and 220B. The structure of the second insulating layer 520 will be described in more detail later.

The second insulating layer 520 may be disposed so that some portions of the electrode branches 210B and 220B may be exposed, so that contact electrodes 260 to be described later can come in contact with each of the electrode branches 210B and 220B at the exposed portions. Accordingly, electric signals applied to the electrodes 210 and 220 may be transmitted to the light-emitting elements 300 through the contact electrodes 260.

The second insulating layer 520 may form a bond with each of the light-emitting elements 300 aligned thereon. The light-emitting elements 300 and the second insulating layer 520 may include functional groups capable of forming bonds. According to an embodiment of the disclosure, the light-emitting elements 300 may include first functional groups 385c, and the second insulating layer 520 may include second functional groups 521. The first functional groups 385c and the second functional groups 521 may form covalent bonds. The bonds formed between the functional groups can fix the light-emitting elements 300 on the second insulating layer 520.

Accordingly, during the process of fabricating the display device 10, the second insulating layer 520 can form chemical bonds with the light-emitting elements 300, so that the light-emitting elements 300 may not be disconnected from the electrodes 210 and 220 and can be fixed thereon. In other words, the light-emitting elements 300 can hold their aligned positions even in case that hydrodynamic force may be applied, and thus it may be possible to improve the alignment of the light-emitting elements 300 in the completed display device 10. More detailed descriptions thereon will be made below with reference to the other drawings.

The contact electrodes 260 may be disposed on the first electrode branches 210B and the second electrode branch 220B. The contact electrodes 260 may be disposed on the first insulating layer 510 and the second insulating layer 520 disposed thereon (not shown in FIG. 1). For example, the contact electrodes 260 may be disposed substantially on the first insulating layer 510 and the second insulating layer 520 so that they overlap the first electrode branches 210B and the second electrode branch 220B.

The contact electrodes 260 may be extended in the second direction D2 and may be spaced apart from each other in the first direction D1. The contact electrodes 260 may be in contact with at least an end of the light-emitting elements 300, and the contact electrodes 260 may be in contact with the first electrode 210 or the second electrode 220 to receive electric signals.

The contact electrodes 260 may be in contact with the first electrode branches 210B and the second electrode branch 220B at the portions exposed by patterning the second insulating layer 520 partially covering the first electrode branches 210B and the second electrode branch 220B. Accordingly, the contact electrodes 260 may transmit electric signals from the first electrodes 210 and the second electrodes 220 to the light-emitting elements 300.

The contact electrodes 260 may be disposed on the electrode branches 210B and 220B so as to partly cover the electrode branches 210B and 220B. The contact electrodes 260 may include first and second contact electrodes 261 and 262 in contact with an end or another end of each of the light-emitting elements 300.

The first contact electrode 261 may be disposed on the first electrode branches 210B and may be in contact with the end of each of the light-emitting elements 300 to electrically connect the light-emitting elements 300 with the first electrode 210. The second contact electrode 262 may be disposed on the second electrode branches 220B and may be in contact with another end of each of the light-emitting elements 300 to electrically connect the light-emitting elements 300 with the second electrode 220.

In some embodiments, both ends of each of the light-emitting elements 300 electrically connected to the first electrode branch 210B or the second electrode branch 220B may be n-type or p-type doped conductive semiconductor layers. In case that an end of each of the light-emitting elements 300 electrically connected to the first electrode branch 210B is a p-type doped conductive semiconductor layer, another end of each of the light-emitting elements 300 electrically connected to the second electrode branch 220B may be an n-type doped conductive semiconductor layer. It is, however, to be understood that the disclosure is not limited thereto. The types of the semiconductor layers may be reversed.

The first contact electrode 261 and the second contact electrode 262 may be disposed on the first electrode branch 210B and the second electrode branch 220B, respectively, to partially cover the first electrode branch 210B and the second electrode branch 220B. As shown in FIG. 1, the first contact electrode 261 and the second contact electrode 262 may be extended in the second direction D2 and may be spaced apart from each other. It is to be noted that the ends of the first contact electrode 261 and the second contact electrode 262 may be terminated so that the ends of the electrode branches 210B and 220B may be partially exposed. Other ends of the first contact electrode 261 and the second contact electrode 262 may be terminated while being spaced apart from the electrode stems 210S and 220S so that they do not overlap the electrode stems 210S and 220S. It is, however, to be understood that the disclosure is not limited thereto. The first contact electrode 261 and the second contact electrode 262 may cover the electrode branches 210B and 220B, respectively.

Incidentally, as shown in FIG. 1, the first electrode stem 210S and the second electrode stem 220S may be electrically connected to a thin-film transistor 120 or a power supply line 161 to be described below through contact holes, e.g., a first electrode contact hole CNTD and a second electrode contact hole CNTS, respectively. Although the contact holes on the first electrode stem portion 210S and the second electrode stem portion 220S may be formed in each of the pixels PX, the disclosure is not limited thereto. Since the second electrode strip portion 220S may be extended and electrically connected to adjacent pixels PX as described above, in some embodiments, the second electrode stem portion 220S may be electrically connected to a thin-film transistor through a single contact hole.

Figure 2:
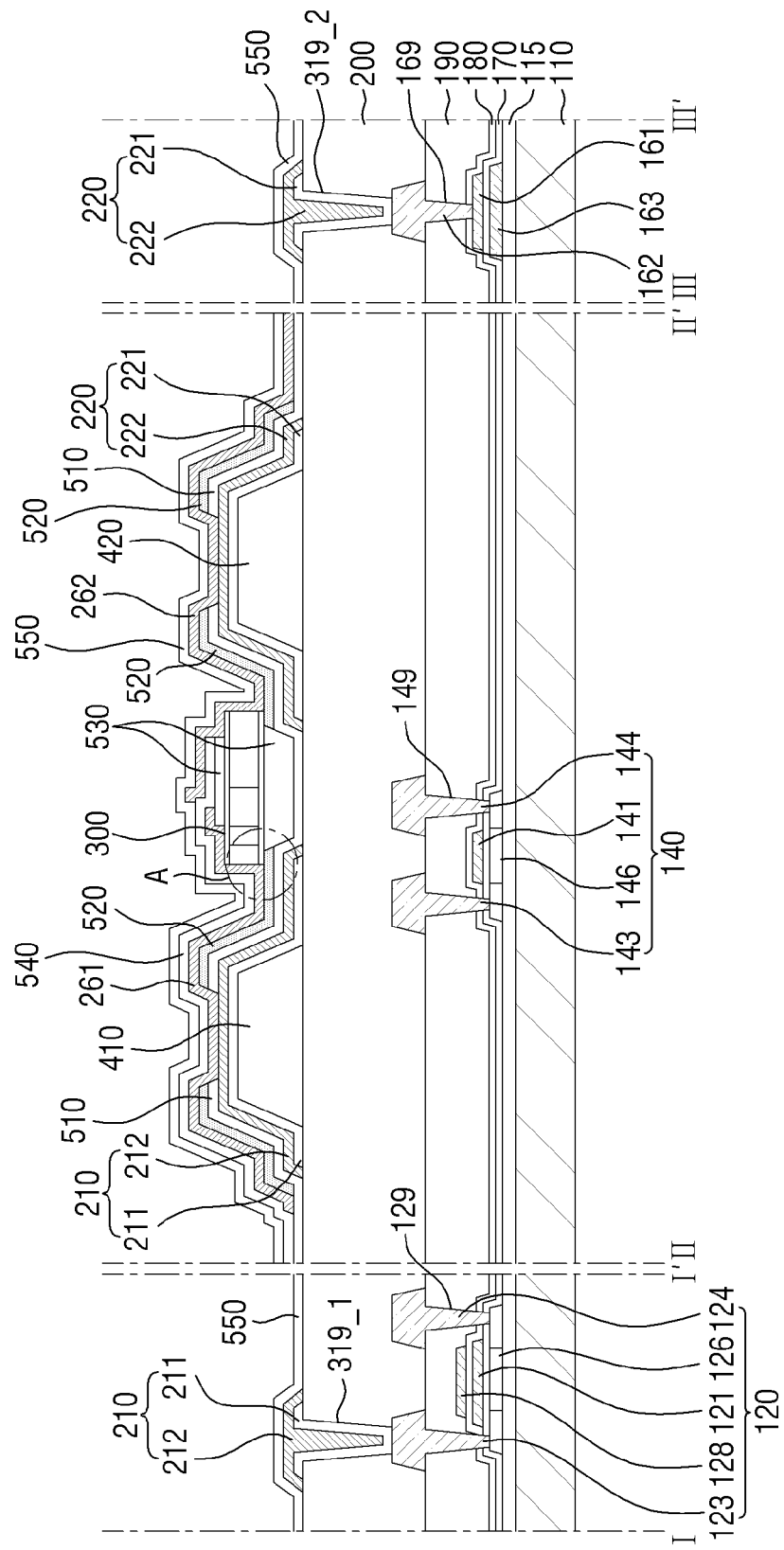
FIG. 2 is a schematic cross-sectional view taken along lines I-I, II-II' and III-III' of FIG. 1.

Although not shown in FIG. 1, the display device 10 may include a third insulating layer 530 (see FIG. 2) disposed to cover at least a part of each of the electrodes 210 and 220 and the light-emitting elements 300, a fourth insulating layer 540 (see FIG. 2), and a passivation layer 550 (see FIG. 2). The relative arrangement and structure will be described later with reference to FIG. 2.

Hereinafter, a number of elements disposed on the display device 10 will be described in more detail with reference to FIG. 2.

FIG. 2 is a schematic cross-sectional view taken along lines I-I, II-II' and III-III' of FIG. 1. Although FIG. 2 shows only one pixel PX, it is to be understood that the descriptions can be equally applied to other pixels as well. FIG. 2 shows a cross section traversing a first end and a second end of a light-emitting element 300.

Referring to FIGS. 1 and 2, a display device 10 may include a substrate 110, one or more thin-film transistors 120 and 140 disposed on the substrate 110, electrodes 210 and 220 and light-emitting elements 300 disposed above the thin-film transistors 120 and 140. The thin-film transistors may include a first thin-film transistor 120 and the second thin-film transistor 140, which may be driving transistors or switching transistors. Each of the thin-film transistors 120 and 140 may have an active layer, a gate electrode, a source electrode and a drain electrode. The first electrode 210 may be electrically connected to the drain electrode of the first thin-film transistor 120. Although the first electrode 210 may be connected to (e.g., directly to) the first thin-film transistor 120 in the example shown in FIG. 2, the disclosure is not limited thereto. The first electrode 210 may be electrically connected to the first thin-film transistor 120 through a conductive layer.

More specifically, the substrate 110 may be an insulating substrate. The substrate 110 may be made of an insulating material such as glass, quartz, a polymer resin, or a combination thereof. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be either a rigid substrate or a flexible substrate that can be bent, folded, or rolled.

A buffer layer 115 may be disposed on the substrate 110. The buffer layer 115 may prevent impurity ions from diffusing, may prevent permeation of moisture or outside air, and may provide a flat surface. The buffer layer 115 may include silicon nitride, silicon oxide, silicon oxynitride, or the like, or a combination thereof.

A semiconductor layer may be disposed on the buffer layer 115. The semiconductor layer may include a first active layer 126 of the first thin-film transistor 120, a second active layer 146 of the second thin-film transistor 140, and an auxiliary layer 163. The semiconductor layer may include polycrystalline silicon, monocrystalline silicon, an oxide semiconductor, etc., or a combination thereof.

A first gate insulating layer 170 may be disposed on the semiconductor layer. The first gate insulating layer 170 covers the semiconductor layer. The first gate insulating layer 170 may work as a gate insulating layer of the thin-film transistors. The first gate insulating layer 170 may include silicon oxide, silicon nitride, silicon oxynitride, aluminum oxide, tantalum oxide, hafnium oxide, zirconium oxide, titanium oxide, etc. The materials may be used alone or in combinations.

A first conductive layer may be disposed on the first gate insulating layer 170. The first conductive layer may include a first gate electrode 121, a second gate electrode 141 and a power supply line 161 which may be disposed on the first active layer 126 of the first thin-film transistor 120, on the second active layer 146 of the second thin-film transistor 140, and on the auxiliary layer 163, respectively, with the first gate insulating layer 170 therebetween. The first conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be made up of a single layer or multiple layers.

A second gate insulating layer 180 may be disposed on the first conductive layer. The second gate insulating layer 180 may be an interlayer dielectric layer. The second gate insulating layer 180 may be made of an inorganic insulating material such as silicon oxide, silicon nitride, silicon oxynitride, hafnium oxide, aluminum oxide, titanium oxide, tantalum oxide, zinc oxide, or a combination thereof.

A second conductive layer may be disposed on the second gate insulating layer 180. The second conductive layer may include a capacitor electrode 128 disposed above the first gate electrode 121 with the second gate insulating layer 180 therebetween. The capacitor electrode 128 may form a storage capacitor with the first gate electrode 121.

The second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), like the first conductive layer described above.

An interlayer dielectric layer 190 may be disposed on the second conductive layer. The interlayer dielectric layer 190 may be an interlayer dielectric film. The interlayer dielectric layer 190 may also provide a flat surface. The interlayer dielectric layer 190 may include an organic insulating material such as polyacrylate resin, epoxy resin, phenolic resin, polyamide resin, polyimide resin, unsaturated polyesters resin, poly phenylene ether resin, poly phenylene sulfide resin, benzocyclobutene (BCB), or a combination thereof.

A third conductive layer may be disposed on the interlayer dielectric layer 190. The third conductive layer may include the first drain electrode 123 and the first source electrode 124 of the first thin-film transistor 120, the second drain electrode 143 and the second source electrode 144 of the second thin-film transistor 140, and a power supply electrode 162 disposed on the power supply line 161.

The first source electrode 124 and the first drain electrode 123 may be electrically connected to the first active layer 126 through the first contact holes 129 penetrating the interlayer dielectric layer 190 and the second gate insulating layer 180, respectively. The second source electrode 144 and the second drain electrode 143 may be electrically connected to the second active layer 146 through the second contact holes 149 penetrating the interlayer dielectric layer 190 and the second gate insulating layer 180, respectively. The power supply electrode 162 may be electrically connected to the power supply line 161 through a third contact hole 169 penetrating the interlayer dielectric layer 190 and the second gate insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be made up of a single film or multiple films. For example, the third conductive layer may have a stack structure of Ti/Al/Ti, Mo/Al/Mo, Mo/AlGe/Mo, and Ti/Cu.

An insulating substrate layer 200 may be disposed over the third conductive layer. The insulating substrate layer 200 may be made of an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The surface of the insulating substrate layer 200 may be flat.

Banks 410 and 420 may be disposed on the insulating substrate layer 200. The banks 410 and 420 may be spaced apart from each other and face each other in each of the pixels PX. The first and second electrodes 210 and 220 may be disposed on the banks 410 and 420, e.g., a first bank 410 and a second bank 420. In the example shown in FIG. 1, three banks 410 and 420, specifically, two first banks 410 and one second bank 420 may be disposed in a pixel PX, and the first electrode 210 and the second electrode 220 may be disposed to cover the three banks 410 and 420. FIG. 2 is the cross-sectional view showing only one of the first banks 410 and one second bank 420. The arrangement structure thereof may be equally applied to another first bank 410 not shown in FIG. 2.

It is to be noted that the number of banks 410 and 420 is not limited thereto. For example, a greater number of banks 410 and 420 may be disposed in a pixel PX, so that a greater number of first and second electrodes 210 and 220 may be disposed. The banks 410 and 420 may include at least one first bank 410 on which the first electrode 210 may be disposed, at least one second bank 420 on which the second electrode 220 may be disposed. The first bank 410 and the second bank 420 may be spaced apart from each other, and banks may be arranged alternately in a direction. In some embodiments, two first banks 410 may be spaced apart from each other, and one second bank 420 may be disposed between the first banks 410.

Although not shown in FIG. 2, the first electrode 210 and the second electrode 220 may include the electrode stems 210S and 220 and the electrode branches 210B and 220B, respectively, as described above. In other words, the first electrode branch 210B and the second electrode branch 220B may be disposed on the first bank 410 and the second bank 420, respectively.

The banks 410 and 420 may be made of substantially the same material via a single process. The banks 410 and 420 may form a single lattice pattern. The banks 410 and 420 may include polyimide (PI).

Although not shown in the drawings, at least some of the banks 410 and 420 may be disposed at the boundaries between the pixels PX so as to distinguish one from another. The electrodes 210 and 220 may not be disposed on the banks 410 and 420 disposed at the boundaries of the pixels PX. Such banks may also be disposed in a substantially lattice pattern together with the first bank 410 and the second bank 420 described above. At least some of the banks 410 and 420 disposed at the boundaries of the pixels PX may be formed to cover the electrode lines of the display device 10. It is, however, to be understood that the disclosure is not limited thereto. The banks other than the first bank 410 and the second bank 420 on which the electrodes 210 and 220 may be disposed may be disposed by performing an additional process after forming the electrodes 210 and 220.

At least a part of the banks 410 and 420 may protrude from the insulating substrate layer 200. The banks 410 and 420 may protrude upwardly from the plane on which the light-emitting elements 300 may be disposed, and at least a part of the protruding portions may have an inclination. The banks 410 and 420 having the protruding portions with the inclination can reflect light incident on reflective layers 211 and 221 disposed thereon. The light traveling toward the reflective layers 211 and 221 from the light-emitting elements 300 may be reflected off the reflective layers 211 and 221 and transmitted toward the outside of the display device 10, for example, above the banks 410 and 420. The shape of the banks 410 and 420 having the protruding portions is not particularly limited. Although the side surfaces of the banks 410 and 420 may be inclined and the upper surface thereof may be flat, with the sharp corners in the example shown in FIG. 2, the structure is not limited thereto. They may have a rounded protrusion shape.

The reflective layers 211 and 221 may be disposed on the banks 410 and 420.

The first reflective layer 211 may cover the first bank 410, and a part thereof may be electrically connected to the first drain electrode 123 of the first thin-film transistor 120 through a fourth contact hole 319_1 penetrating the insulating substrate layer 200. The second reflective layer 221 covers the second banks 420 and a part thereof may be electrically connected to the power supply electrode 162 through a fifth contact hole 319_2 penetrating through the insulating substrate layer 200.

The first reflective layer 211 may be electrically connected to the first drain electrode 123 of the first thin-film transistor 120 through the fourth contact hole 319_1 in the pixel PX. Accordingly, the first thin-film transistor 120 may be disposed at such a location that it overlaps the pixel PX. In the example shown in FIG. 1, the first electrode 210 may be electrically connected to the first thin-film transistor 120 through the first electrode contact hole CNTD formed on the first electrode stem 210S. For example, the first electrode contact hole CNTD may be the fourth contact hole 319_1.

The second reflective layer 221 may also be electrically connected to the power supply electrode 162 through the fifth contact hole 319_2 in the pixel PX. In FIG. 2, the second reflective layer 221 may be connected through the fifth contact hole 319_2 in a pixel PX. FIG. 1 illustrates that the second electrode 220 of each of the pixels PX may be electrically connected to the power supply line 161 through second electrode contact holes CNTS on the second electrode stem 220S. For example, the second electrode contact hole CNTS may be the fifth contact hole 319_2.

As described above, in the example shown in FIG. 1, the first electrode contact hole CNTD and the second electrode contact hole CNTS may be disposed on the first electrode stem 210S and the second electrode stem 220S, respectively. Accordingly, in the cross-sectional view of FIG. 2 showing the display device 10, the first electrode 210 and the second electrode 220 may be electrically connected to the first thin-film transistor 120 and the power supply line 161 through the fourth contact hole 319_1 and the fifth contact hole 319_2, respectively, at the areas spaced apart from the banks on which the first electrode branch 210B and the second electrode branch 220B may be disposed.

It is, however, to be understood that the disclosure is not limited thereto. For example, in FIG. 1, the second electrode contact hole CNTS may be formed at various positions on the second electrode stem 220S, and in some implementations, may be located on the second electrode branch 220B. Further, in some embodiments, the second reflective layer 221 may be connected to one second electrode contact hole CNTS or the fifth contact hole 319_2 in an area other than a pixel PX.

There may be a non-emission area where no light-emitting element 300 may be disposed, in an area other than the emission area where the pixels PX of the display device 10 may be disposed, for example, on the outer side of the pixels PX. As described above, the second electrodes 220 of each pixel PX may be electrically connected to each other through the second electrode stem 220S to receive the same electric signal.

In some embodiments, the second electrode stem 220S of the second electrode 220 may be electrically connected to the power supply electrode 162 through the second electrode contact hole CNTS in the non-emission area located on the outer side of the display device 10. Unlike the display device 10 shown in FIG. 1, even though the second electrode stem 220S may be connected to the power supply electrode 162 through one contact hole, the second electrode stem 220S may be extended to and electrically connected to the adjacent pixel PX, it may be possible to apply the same electrical signal to the second electrode branch 220B of each pixel PX. For the second electrode 220 of the display device 10, the position of the contact hole for receiving the electric signal from the power supply electrode 162 may vary depending on the structure of the display device 10.

Referring back to FIGS. 1 and 2, the reflective layers 211 and 221 may include a material having a high reflectivity to reflect light emitted from the light-emitting elements 300. For example, the reflective layers 211 and 221 may include, but are not limited to, materials such as silver (Ag), copper (Cu), or a combination thereof.

The first electrode layer 212 and the second electrode layer 222 may be disposed on the first reflective layer 211 and the second reflective layer 221, respectively.

The first electrode layer 212 may be disposed on (e.g., directly on) the first reflective layer 211. The first electrode layer 212 may have substantially the same pattern as the first reflective layer 211. The second electrode layer 222 may be disposed on (e.g., directly on) the second reflective layer 221 and may be spaced apart from the first electrode layer 212. The second electrode layer 222 may have substantially the same pattern as the second reflective layer 221.

In an embodiment, the electrode layers 212 and 222 may cover the reflective layers 211 and 221 thereunder, respectively. For example, the electrode layers 212 and 222 may be larger than the reflective layers 211 and 221 to cover the side surfaces of the ends of the reflective layers 211 and 221. It is, however, to be understood that the disclosure is not limited thereto.

The first electrode layer 212 and the second electrode layer 222 may transmit electrical signals transmitted to the first reflective layer 211 and the second reflective layer 221 connected to the first thin-film transistor 120 or the power supply electrode 162, respectively, to the contact electrodes 261 and 262 to be described below. The electrode layers 212 and 222 may include a transparent conductive material. For example, the electrode layers 212 and 222 may include, but are not limited to, a material such as indium tin oxide (ITO), indium zinc oxide (IZO) and indium tin zinc oxide (ITZO). In some embodiments, each of the reflective layers 211 and 221 and the electrode layers 212 and 222 may have a structure in which at least one transparent conductive layer such as ITO, IZO and ITZO and at least one metal layer such as silver and copper may be stacked on one another. For example, the reflective layers 211 and 221 and the electrode layers 212 and 222 may form a stack structure of ITO/silver (Ag)/ITO.

The first reflective layer 211 and the first electrode layer 212, which may be disposed on the first pixel-defining layer 410, may form the first electrode 210. The first electrode 210 may protrude to areas extended from both ends of the first pixel-defining layer 410 so that the first electrode 210 may be in contact with the insulating substrate layer 200. The second reflective layer 221 and the second electrode layer 222, which may be disposed on the second pixel-defining layer 420, may form the second electrode 220. The second electrode 220 may protrude to areas extended from both ends of the second pixel-defining layer 420 so that the second electrode 220 may be in contact with the insulating substrate layer 200.

The first electrode 210 and the second electrode 220 may cover the entire area of the first bank 410 and the second bank 420. As described above, the first electrode 210 may be spaced apart from and face the second electrode 220. The first insulating layer 510 may be disposed between the electrodes spaced apart from one another, which will be described in detail below, and the second insulating layer 520 and the light-emitting elements 300 may be disposed on the first insulating layer 510.

Since the first reflective layer 211 may receive a driving voltage from the first thin-film transistor 120 and the second reflective layer 221 may receive a power supply voltage from the power supply line 161, the first electrode 210 and the second electrode 220 receive the driving voltage and the power supply voltage, respectively.

Specifically, the first electrode 210 may be electrically connected to the first thin-film transistor 120, and the second electrode 220 may be electrically connected to the power supply line 161. Accordingly, a first contact electrode 261 and a second contact electrode 262 disposed on the first electrode 210 and the second electrode 220 can receive the driving voltage and the power supply voltage. The driving voltage and power supply voltage may be transmitted to the light-emitting elements 300, and a predetermined current may flow in the light-emitting elements 300 to emit light.

The first insulating layer 510 may be disposed on the first electrode 210 and the second electrode 220 to partially cover the first electrode 210 and the second electrode 220. The first insulating layer 510 may cover most of the upper surface of each of the first electrode 210 and the second electrode 220 and may expose a part of each of the first electrode 210 and the second electrode 220. The first insulating layer 510 may be disposed in a space between the first electrode 210 and the second electrode 220. Referring to FIG. 1, the first insulating layer 510 may be disposed to have an island shape or a linear shape along the space between the first electrode branch 210B and the second electrode branch 220B when viewed from the top.

In the example shown in FIG. 2, the first insulating layer 510 may be disposed in space between one first electrode 210, e.g., the first electrode branch 210B and one second electrode 220, e.g., the second electrode branch 220B. However, as described above, since there may be multiple first electrodes 210 and multiple second electrodes 220, the first insulating layer 510 may be disposed between one first electrode 210 and another second electrode 220 or between one second electrode 220 and another first electrode 210.

The first insulating layer 510 may overlap some portions of the electrodes 210 and 220, e.g., a part of the protruding portions in the direction in which the first electrode 210 and the second electrode 220 face each other. The first insulating layer 510 may also be disposed in the portions where the electrodes 210 and 220 overlap the inclined side surfaces and the flat upper surfaces of the banks 410 and 420. The first insulating layer 510 may be disposed to partially cover the first electrode 210 and the second electrode 220 on opposite sides of the side portions where the first electrode 210 and the second electrode 220 face each other. For example, the first insulating layer 510 may be disposed to expose only the center portions of the first electrode 210 and the second electrode 220.

The first insulating layer 510 may be disposed between the light-emitting elements 300 and the insulating substrate layer 200. The lower surface of the first insulating layer 510 may be in contact with the insulating substrate layer 200, and the light-emitting elements 300 may be disposed on the upper surface of the first insulating layer 510. The first insulating layer 510 may be in contact with the electrodes 210 and 220 on both sides and can electrically insulate the electrodes 210 and 220 from each other.

For example, the first insulating layer 510 may cover the end portions protruding in the direction in which the first electrode 210 faces the second electrode 220. A part of the lower surface of the first insulating layer 510 may be in contact with the insulating substrate layer 200, and a part of the lower surface and the side surfaces may be in contact with the electrodes 210 and 220. Accordingly, the first insulating layer 510 can protect the portions that overlap the electrodes 210 and 220 and electrically insulate the electrodes 210 and 220 from each other. The first insulating layer 510 can prevent a first conductivity-type semiconductor 310 and a second conductivity-type semiconductor 320 of each of the light-emitting elements 300 from being in contact with other substrates, so that damage to the light-emitting elements 300 can be avoided.

It is, however, to be understood that the disclosure is not limited thereto. According to some embodiments of the disclosure, the first insulating layer 510 may be disposed only on the portions of the first electrode 210 and the second electrode 220 that overlap the inclined side surfaces of the banks 410 and 420. The lower surface of the first insulating layer 510 may be terminated at the inclined side surfaces of the banks 410 and 420, and the electrodes 210 and 220 disposed on a part of the inclined side surfaces of the banks 410 and 420 may be exposed to be in contact with the contact electrodes 260.

The first insulating layer 510 may be disposed so that both ends of each of the light-emitting elements 300 may be exposed. Accordingly, the contact electrodes 260 may be in contact with the exposed upper surface of each of the electrodes 210 and 220 and both ends of the light-emitting elements 300, and the contact electrodes 260 may transfer the electric signal applied to the first electrode 210 and the second electrode 220 to the light-emitting elements 300.

The second insulating layer 520 may be disposed on the first insulating layer 510. The second insulating layer 520 may be disposed on the first insulating layer 510, and may partially overlap the light-emitting elements 300 aligned between the first electrode 210 and the second electrode 220.

In the example shown in FIG. 2, the second insulating layer 520 may be disposed to partially cover the first electrode 210 and the second electrode 220 and may not be disposed in the space between the first electrode 210 and the second electrode 220. In other words, the second insulating layer 520 may be disposed substantially in the same shape as the first insulating layer 510, but may not be disposed under the center of the lower surface of the light-emitting element 300.

It is, however, to be understood that the disclosure is not limited thereto. The second insulating layer 520 may have a structure separate from the first insulating layer 510. More detailed description thereon will be given with reference to other embodiments.

The second insulating layer 520 may include an organic material. The second insulating layer 520 may work as a protective layer that prevents the light-emitting elements 300 from being in direct contact with other electrodes 210 and 220. As described above, the second insulating layer 520 may include the second functional groups 521 to form bonds with the light-emitting elements 300.

The lower surface of the first insulating layer 510 may be in contact with each of the electrodes 210 and 220 to protect and insulate the electrodes 210 and 220 from each other so that they may not be in direct contact with each other. The upper surface of the first insulating layer 510 may be partially in contact with the light-emitting elements 300, and it may be also possible to prevent the light-emitting elements 300 from being in direct contact with each of the electrodes 210 and 220. On the other hand, the lower surface of the second insulating layer 520 may not be in direct contact with each of the electrodes 210 and 220 but may be in contact only with the first insulating layer 510. The second insulating layer 520 can protect the light-emitting elements 300 and can also fix the light-emitting elements 300 on the first insulating layer 510 as its upper surface may be partially coupled with the light-emitting elements 300. At least one of the light-emitting elements 300 may be disposed between the first electrode 210 and the second electrode 220, and the lower surface of each of the light-emitting elements 300 may include a region overlapping the second insulating layer 520. In the areas where the light-emitting elements 300 and the second insulating layer 520 overlap each other, the first functional groups 385c of the light-emitting elements 300 and the second functional groups 521 of the second insulating layer 520 may form covalent bonds.

Figure 3:
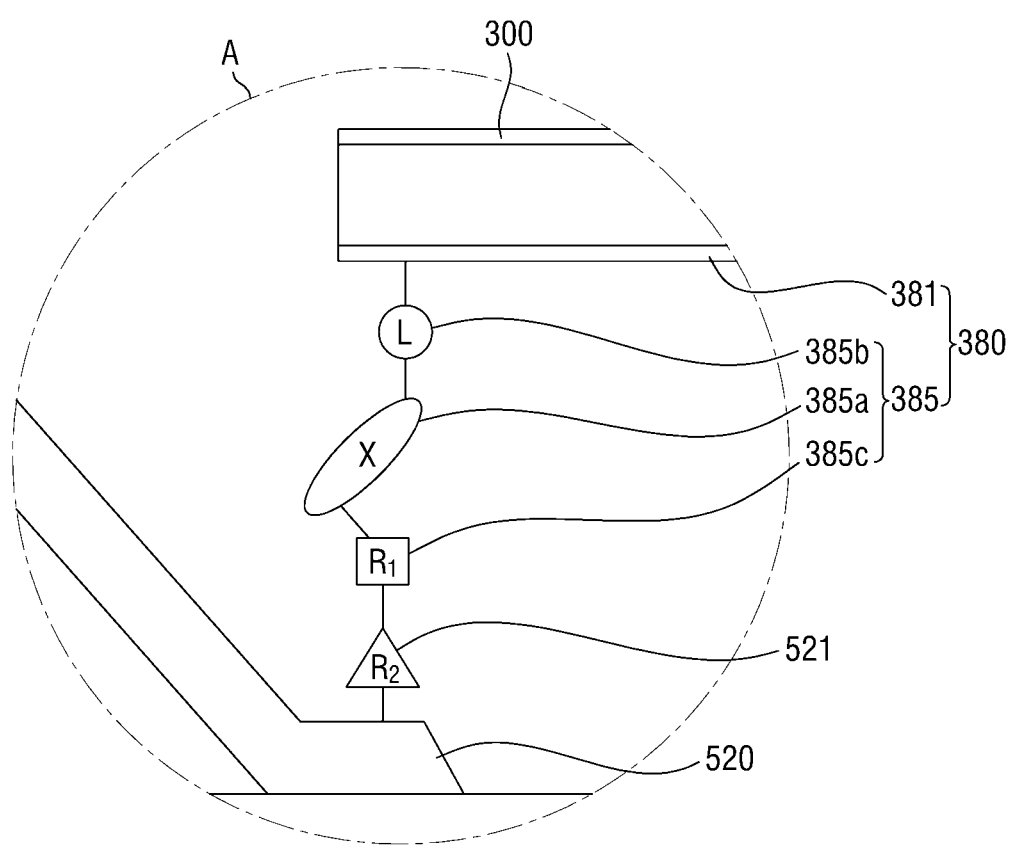
FIG. 3 is an enlarged schematic view of portion A of FIG. 2.

FIG. 3 is an enlarged schematic view of portion A of FIG. 2.

In example shown in FIG. 3, the light-emitting element 300 may be spaced apart from the second insulating layer 520 for convenience of illustration. It is to be noted that they are shown as being separated from one another in order to illustrate the bonding relationship between a first functional group 385c of a binding group 385 and a second functional groups 521 of the second insulating layer 520. In practice, the light-emitting element 300 may be in contact with the second insulating layer 520 in the display device 10.

Referring to FIG. 3, the light-emitting element 300 may include the binding group 385, and the binding group 385 may include a main chain 385a, a linker 385b and a first functional group 385c. The second insulating layer 520 may include the second functional group 521 capable of forming a covalent bond with the first functional group 385c. The covalent bond formed by the first functional group 385c and the second functional group 521 can fix the light-emitting element 300 at the areas where the light-emitting element 300 overlaps the second insulating layer 520. Accordingly, the light-emitting element 300 can hold its initially aligned position even after performing the process of fabricating the display device 10. In the completed display device 10, the light-emitting elements 300 can have a high degree of alignment, and connection or contact failure of the light-emitting elements 300 can be reduced.

Although the cross-sectional view of FIG. 2 shows that one light-emitting element 300 may be disposed between the first electrode 210 and the second electrode 220, it is to be understood that multiple light-emitting elements 300 may be disposed in another direction, e.g., in the second direction DR2 when viewed from the top as shown in FIG. 1.

An end of the light-emitting element 300 may be electrically connected to the first electrode 210, and another end thereof may be electrically connected to the second electrode 220. The ends of the light-emitting element 300 may be in contact with the first contact electrode 261 and the second contact electrode 262, respectively.

FIG. 1 illustrates an example where only the light-emitting elements 300 that emit light of the same color may be disposed in each pixel PX. It is, however, to be understood that the light-emitting elements 300 emitting lights of different colors may be disposed in a pixel PX, as mentioned earlier.

The light-emitting elements 300 may be light-emitting diodes. The light-emitting elements 300 may be a nanostructure having its size generally in nanometer scale. The light-emitting elements 300 may be inorganic light-emitting diodes made of an inorganic material. In case that a light-emitting element 300 is an inorganic light-emitting diode, by disposing a light-emitting material having an inorganic crystal structure between two opposing electrodes and applying an electric field in a direction across the light-emitting material, the inorganic light-emitting diodes can be aligned between the two electrodes having the polarities.

In some embodiments, the light-emitting element 300 may have a structure in which a first conductivity-type semiconductor 310, an active layer 330, a second conductivity-type semiconductor 320 and an electrode material layer 370 may be stacked on one another. In the light-emitting element 300, the first conductivity-type semiconductor 310, the active layer 330, the second conductivity-type semiconductor 320 and the electrode material layer 370 may be arranged in the direction parallel to the insulating substrate layer 200 in this order. In other words, the light-emitting element 300, in which the layers may be stacked on one another, may be disposed in the horizontal direction in parallel with the insulating substrate layer 200. It is, however, to be understood that the disclosure is not limited thereto. The light-emitting element 300 may be disposed between the first electrode 210 and the second electrode 220 such that the above-described elements may be arranged in the opposite order. The configuration of the light-emitting element 300 will be described in more detail later.

The third insulating layer 530 may be disposed such that it overlaps at least a part of the light-emitting element 300. The third insulating layer 530 can protect the light-emitting element 300 and can fix the light-emitting element 300 between the first electrode 210 and the second electrode 220.

Although the third insulating layer 530 may be disposed on the upper surface of the light-emitting element 300 in the cross-sectional view of FIG. 2, the third insulating layer 530 may be disposed to surround the outer surface of the light-emitting element 300. For example, like the first insulating layer 510, the third insulating layer 530 may be extended in the second direction DR2 along the space between the first electrode branch 210B and the second electrode branch 220B so that it has an island-like or a linear shape when viewed from the top.

A part of the material of the third insulating layer 530 may be disposed in an area where the lower surface of the light-emitting element 300 and the first insulating layer 510 may be in contact with each other. Such material may be formed in case that the light-emitting element 300 may be aligned on the first insulating layer 510 and the third insulating layer 530 may be disposed thereon during the process of fabricating the display device 10. If some voids may be formed in the first insulating layer 510 in contact with the lower surface of the light-emitting element 300, a part of the material of the third insulating layer 530 may intrude into the voids in case that the third insulating layer 530 may be formed.

The third insulating layer 530 may be disposed such that both side surfaces of the light-emitting element 300 may be exposed. For example, the third insulating layer 530 disposed on the upper surface of the light-emitting element 300 has a length measured in one axial direction shorter than the light-emitting element 300 in the cross-sectional view, and thus the third insulating layer 530 may be recessed inward than the both side surfaces of the light-emitting element 300. Accordingly, the side surfaces of the first insulating layer 510, the light-emitting element 300 and the third insulating layer 530 may have a stair-like shape. By doing so, the contact electrodes 261 and 262, which will be described later, can be easily brought into contact with the both end surfaces of the light-emitting element 300. It is, however, to be understood that the disclosure is not limited thereto. The length of the third insulating layer 530 may be equal to the length of the light-emitting element 300 so that their side surfaces may be aligned with each other, respectively.

Incidentally, the third insulating layer 530 may be disposed to cover the first insulating layer 510 and the second insulating layer 520, and some of the portions may be patterned so that the light-emitting element 300 may be exposed to be in contact with the contact electrodes 260, for example. The third insulating layer 530 may be patterned by dry etching or wet etching well known in the art. In order to avoid the first insulating layer 510 from being patterned, the first insulating layer 510 and the third insulating layer 530 may include materials having different etching selectivity. In other words, in case that the third insulating layer 530 may be patterned, the first insulating layer 510 may work as an etching stopper.

Accordingly, even though the third insulating layer 530 may be patterned so that it covers the outer surface of the light-emitting element 300 and both ends of the light-emitting element 300 may be exposed, the material of the first insulating layer 510 may not be damaged. In particular, the first insulating layer 510 and the light-emitting element 300 may form a smooth contact surface at both ends of the light-emitting element 300 where the light-emitting element 300 and the contact electrodes 260 may be in contact with each other.

On the third insulating layer 530, a first contact electrode 261 that may be disposed on the first electrode 210 and overlaps at least a part of the third insulating layer 530, and a second contact electrode 262 that may be disposed on the second electrode 220 and overlaps at least a part of the third insulating layer 530 may be disposed.

The first contact electrode 261 and the second contact electrode 262 may be disposed on the upper surfaces of the first electrode 210 and the second electrode 220, respectively. Specifically, the first contact electrode 261 and the second contact electrode 262 may be in contact with the first electrode layer 212 and the second electrode layer 222, respectively, in the area where the first insulating layer 510 and the second insulating layer 520 may be patterned so that parts of the first electrode 210 and the second electrode 220 may be exposed. Each of the first contact electrode 261 and the second contact electrode 262 may be in contact with one end surface of the light-emitting element 300, e.g., the first conductivity-type semiconductor 310, the second conductivity-type semiconductor 320 or the electrode material layer 370. Accordingly, the first contact electrode 261 and the second contact electrode 262 may transmit an electric signal applied to the first electrode layer 212 and the second electrode layer 222 to the light-emitting element 300.

The first contact electrode 261 may be disposed on and partially cover the first electrode 210. The lower surface of the first contact electrode 261 may be in contact with a part of each of the light-emitting element 300, the first insulating layer 510, the second insulating layer 520 and the third insulating layer 530. One end of the first contact electrode 261 closer to the second electrode 220 may be disposed on the third insulating layer 530. The second contact electrode 262 may be disposed on and partially cover the second electrode 220. The lower surface of the second contact electrode 262 may be in contact with a part of each of the light-emitting element 300, the first insulating layer 510, the second insulating layer 520 and the fourth insulating layer 540. One end of the second contact electrode 262 closer to the first contact electrode 261 may be disposed on the fourth insulating layer 540.

The first insulating layer 510, the second insulating layer 520 and the third insulating layer 530 may be patterned so that their portions covering the first and second electrodes 210 and 220 on the upper surfaces of the first and second banks 410 and 420 may be removed. Accordingly, the first electrode layer 212 of the first electrode 210 and the second electrode layer 222 of the second electrode 220 may be exposed and may be electrically connected to the contact electrodes 261 and 262, respectively.

The first contact electrode 261 and the second contact electrode 262 may be disposed on the third insulating layer 530 or the fourth insulating layer 540 such that they may be spaced apart from each other. Specifically, the first contact electrode 261 and the second contact electrode 262 may be in contact with the third insulating layer 530 or the fourth insulating layer 540 together with the light-emitting element 300, but may be electrically insulated therefrom as they may be spaced apart from each other in the stacking direction. Accordingly, the first contact electrode 261 and the second contact electrode 262 may receive different power supply voltages from the first thin-film transistor 120 and the power supply line 161. For example, the first contact electrode 261 may receive a driving voltage applied to the first electrode 210 from the first thin-film transistor 120, and the second contact electrode 262 may receive a common power supply voltage applied to the second electrode 220 from the power supply line 161. It is, however, to be understood that the disclosure is not limited thereto.

The contact electrodes 261 and 262 may include a conductive material. For example, the contact electrodes may include ITO, IZO, ITZO, aluminum (Al), etc., or a combination thereof. It is, however, to be understood that the disclosure is not limited thereto.

The contact electrodes 261 and 262 may include the same material as the electrode layers 212 and 222. The contact electrodes 261 and 262 may be arranged in substantially the same pattern on the electrode layers 212 and 222 so as to be in contact with the electrode layers 212 and 222. For example, the first contact electrode 261 and the second contact electrode 262 which may be in contact with the first electrode layer 212 and the second electrode layer 222, respectively, receive an electrical signal applied to the first electrode layer 212 and the second electrode layer 222 to transmit the electrical signal to the light-emitting element 300.

The fourth insulating layer 540 may be disposed on the first contact electrode 261 to electrically isolate the first contact electrode 261 from the second contact electrode 262. The fourth insulating layer 540 may be disposed to cover the first contact electrode 261 and may not overlap a part of the light-emitting element 300 so that the light-emitting element 300 can be in contact with the second contact electrode 262. The fourth insulating layer 540 may be partially in contact with the first contact electrode 261, the second contact electrode 262 and the third insulating layer 530 on the upper surface of the third insulating layer 530. The fourth insulating layer 540 may be disposed to cover one end of the first contact electrode 261 on the upper surface of the third insulating layer 530. Accordingly, the fourth insulating layer 540 can protect the first contact electrode 361 and electrically insulate the first contact electrode 261 from the second contact electrode 262.

An end of the fourth insulating layer 540 closer to the second electrode 220 may be aligned with one side surface of the third insulating layer 530.

In some embodiments, the fourth insulating layer 540 may be eliminated from the display device 10. Accordingly, the first contact electrode 261 and the second contact electrode 262 may be disposed on substantially the same plane, and the first contact electrode 261 and the second contact electrode 262 may be electrically insulated from each other by a passivation layer 550 described later.

The passivation layer 550 may be formed over the fourth insulating layer 540 and the second contact electrode 262 to protect elements disposed on the insulating substrate layer 200 from the external environment. If the first contact electrode 261 and the second contact electrode 262 may be exposed, the electrodes may be damaged and thus there may arise a problem of disconnection. To prevent such a problem, the passivation layer 550 may be disposed to cover the electrodes. For example, the passivation layer 550 may be disposed to cover the first electrode 210, the second electrode 220, the light-emitting element 300, etc. If the fourth insulating layer 540 is eliminated as described above, the passivation layer 550 may be formed on the first contact electrode 261 and the second contact electrode 262. The passivation layer 550 may electrically insulate the first contact electrode 261 from the second contact electrode 262.

Each of the first insulating layer 510, the third insulating layer 530, the fourth insulating layer 540 and the passivation layer 550 may include an inorganic insulating material. For example, the first insulating layer 510, the third insulating layer 530, the fourth insulating layer 540 and the passivation layer 550 may include a material such as silicon oxide (SiOx), silicon nitride (SiNx), silicon oxynitride (SiOxNy), aluminum oxide (Al2O3), aluminum nitride (AlN), or a combination thereof. The first insulating layer 510, the third insulating layer 530, the fourth insulating layer 540 and the passivation layer 550 may be made of either the same material or different materials. Each of the first insulating layer 510, the third insulating layer 530, the fourth insulating layer 540 and the passivation layer 550 may be made of any of a variety of materials that give insulation properties.

As described above, the first insulating layer 510 and the third insulating layer 530 may have different etch selectivity. For example, in case that the first insulating layer 510 includes silicon oxide (SiOx), the third insulating layer 530 may include silicon nitride (SiNx). As another example, in case that the first insulating layer 510 includes silicon nitride (SiNx), the third insulating layer 530 may include silicon oxide (SiOx). It is, however, to be understood that the disclosure is not limited thereto.

The second insulating layer 520 may include an organic material containing the second functional groups 521 capable of forming covalent bonds with the first functional groups 385c of the light-emitting elements 300. It is, however, to be understood that the disclosure is not limited thereto. The material of the second insulating layer 520 is not particularly limited as long as it can fix the light-emitting elements 300.

The light-emitting element 300 may be fabricated on a substrate by the epitaxial growth technique. Specifically, a seed crystal layer for forming a semiconductor layer may be formed on the substrate and a desired semiconductor material may be deposited and grown thereon. Hereinafter, the configurations of the light-emitting elements 300 according to various embodiments will be described in detail with reference to FIGS. 4 and 5.

Figure 4:
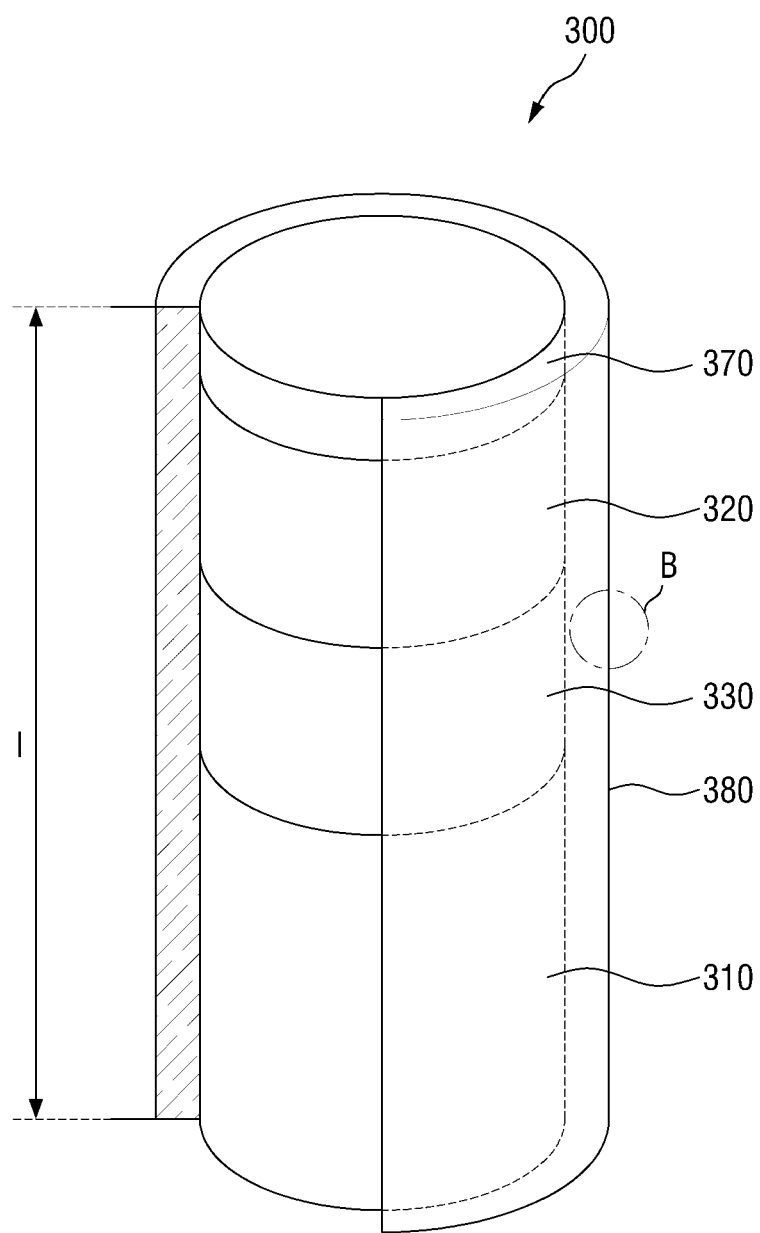
FIG. 4 is a schematic view showing a light-emitting element according to an embodiment of the disclosure.
Figure 5:
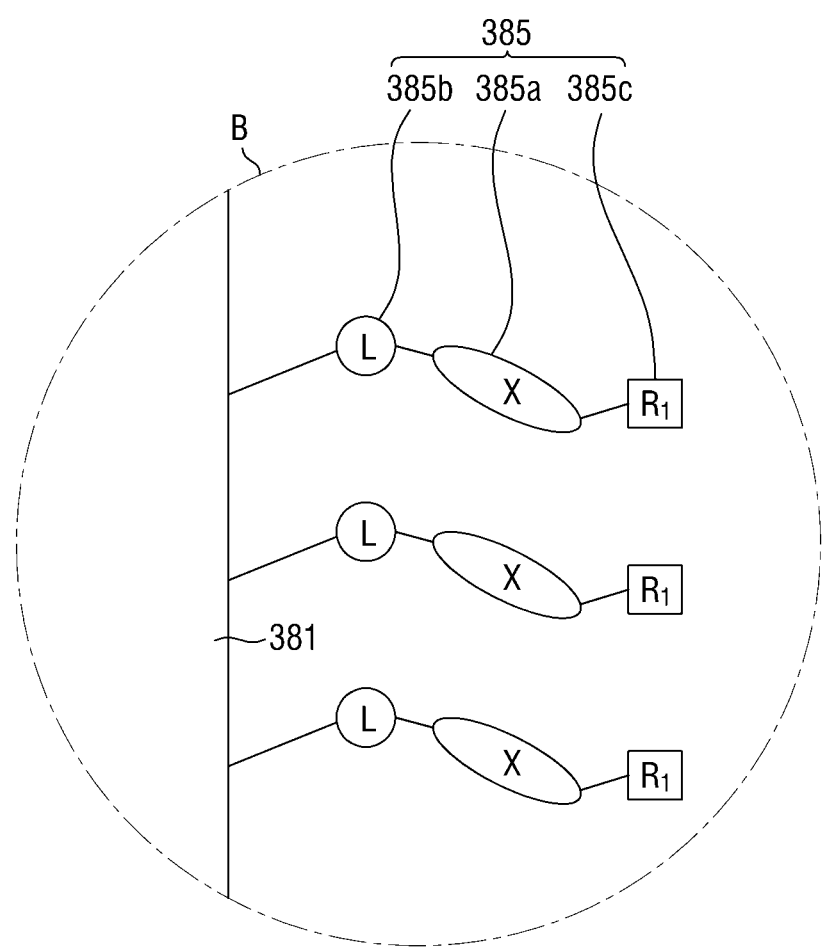
FIG. 5 is an enlarged schematic view of portion B of FIG. 4.

FIG. 4 is a schematic view showing a light-emitting element according to an embodiment of the disclosure. FIG. 5 is an enlarged schematic view of portion B of FIG. 4.

Referring to FIG. 4, the light-emitting element 300 may include conductive semiconductors 310 and 320, an active layer 330, an electrode material layer 370, and an insulating material film 380. An electric signal applied from the first electrode 210 and the second electrode 220 may be transmitted to the active layer 330 via the conductive semiconductor 310 and 320 to emit light.

Specifically, the light-emitting element 300 may include a rod-like semiconductor core including a first conductivity-type semiconductor 310, a second conductivity-type semiconductor 320, an active layer 330 disposed between the first conductivity-type semiconductor 310 and the second conductivity-type semiconductor 320, and an electrode material layer 370 disposed on the second conductive-type semiconductor 320; and an insulating material film 380 surrounding the outer circumferential surface of the semiconductor core. Although the light-emitting element 300 shown in FIG. 4 has the structure in which the first conductivity-type semiconductor 310, the active layer 330, the second conductivity-type semiconductor 320 and the electrode material layer 370 of the semiconductor core may be stacked on one another in the longitudinal direction in this order, the disclosure is not limited thereto. The electrode material layer 370 may be eliminated. In some embodiments, the electrode material layer 370 may be disposed on at least one of both side surfaces of the first and second conductivity-type semiconductors 310 and 320. Hereinafter, the light-emitting element 300 of FIG. 4 will be described as an example. It is to be understood that the following descriptions of the light-emitting element 300 can be equally applied even if the light-emitting element 300 further includes other structures.

The first conductivity-type semiconductor 310 may be an n-type semiconductor layer. For example, in case that the light-emitting element 300 emits light of a blue wavelength band, the first conductivity-type semiconductor 310 may be a semiconductor material having the following formula: $In_xAl_yGa_{(1-x-y)}N$, where $0 \leq x \leq 1$, $0 \leq y \leq 1$, and $0 \leq x+y \leq 1$. For example, it may be at least one of n-type doped InAlGaN, GaN, AlGaN, InGaN, AlN and InN. The first conductivity-type semiconductor 310 may be doped with a first conductivity-type dopant. For example, the first conductivity-type dopant may be Si, Ge, Sn, etc. The length of the first conductivity-type semiconductor 310 may range, but is not limited to, from about 1.5 µm to about 5 µm.

The second conductivity-type semiconductor 320 may be a p-type semiconductor layer. For example, in case that the light-emitting element 300 emits light of a blue wavelength band, the second conductivity-type semiconductor 320 may be a semiconductor material having the following formula: $In_xAl_yGa_{(2-x-y)}N$, where $0 \leq x \leq 1$, $0 \leq y \leq 1$, and $0 \leq x+y \leq 1$. For example, it may be at least one of p-type doped InAlGaN, GaN, AlGaN, InGaN, AlN and InN. The second conductivity-type semiconductor 320 may be doped with a second conductivity-type dopant. For example, the second conductivity-type dopant may be Mg, Zn, Ca, Se, Ba, etc. The length of the second conductivity-type semiconductor 320 may range, but is not limited to, from about 0.08 µm to about 0.25 µm.

The active layer 330 may be disposed between the first conductivity-type semiconductor 310 and the second conductivity-type semiconductor 320 and may include a material having a single or multiple quantum well structure. In case that the active layer 330 includes a material having the multiple quantum well structure, quantum layers and well layers may be alternately stacked in the structure. The active layer 330 may emit light as electron-hole pairs may be combined therein in response to an electrical signal applied through the first conductivity-type semiconductor 310 and the second conductivity-type semiconductor 320. For example, in case that the active layer 330 emits light in the blue wavelength range, the active layer 330 may include a material such as AlGaN, AlInGaN, or a combination thereof. In particular, in case that the active material layer 353 has the multiple quantum well structure in which the quantum layers and the well layers may be stacked on one another alternately, the quantum layers may include AlGaN, AlInGaN, or a combination thereof, and the well layers may include materials such as GaN, AlGaN, or a combination thereof. It is, however, to be understood that the disclosure is not limited thereto. The active layer 330 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the active layer 330 is not limited to the light of the blue wavelength band. The active material layer 353 may emit light of red or green wavelength band in some implementations. The length of the active layer 330 may be, but is not limited to, in the range of about 0.05 μm to about 0.25 μm.

The light emitted from the active layer 330 may exit not only through the outer surfaces of the light-emitting element 300 in the longitudinal direction but also through side surfaces. For example, the direction in which the light exiting from the active layer 330 propagates may not be limited to one direction.

The electrode material layer 370 may be an ohmic contact electrode. It is, however, to be understood that the disclosure is not limited thereto. The electrode material layer may be Schottky contact electrodes. The electrode material layer 370 may include a metal having conductivity. For example, the electrode material layer 370 may include at least one of aluminum (Al), titanium (Ti), indium (In), gold (Au), silver (Ag), indium tin oxide (ITO), indium zinc oxide (IZO), and indium tin-zinc oxide (ITZO). The electrode material layer 370 may include the same material and may include different materials. It is, however, to be understood that the disclosure is not limited thereto.

The insulating material film 380 may be disposed to surround the outer circumferential surface of the semiconductor core. Specifically, the insulating material film 380 may be formed outside the first conductivity-type semiconductor 310, the second conductivity-type semiconductor 320, the active layer 330, and the electrode material layer 370, and can protect the same. For example, the insulating material film 380 may surround the side surfaces of the above-described elements, and may not be formed at both ends of the light-emitting element 300 in the longitudinal direction, e.g., both ends where the first conductivity-type semiconductor 310 and the electrode material layer 370 may be disposed. It is, however, to be understood that the disclosure is not limited thereto.

Although the insulating material film 380 may be extended in the longitudinal direction to cover from the first conductive-type semiconductor 310 to the electrode material layer 370 in the drawings, the disclosure is not limited thereto. The insulating material film 380 may cover only the first conductivity-type semiconductor 310, the active layer 330 and the second conductivity-type semiconductor 320 or may cover only a part of the electrode material layer 370, such that a part of the outer surface of the electrode material layer 370 may be exposed.

The thickness of the insulating material film 380 may be, but is not limited to, in the range of about 0.5 μm to about 1.5 μm.

The insulating material film 380 may include an insulation film 381 and a binding group 385 coupled to the insulation film 381. Specifically, the insulation film 381 may have insulating properties and can protect the first conductivity-type semiconductor 310, the second conductivity-type semiconductor 320, the active layer 330, and the electrode material layer 370.

The insulation film 381 may include materials having insulating properties such as silicon oxide (SiOx), silicon nitride (SiNx), silicon oxynitride (SiOxNy), aluminum nitride (AlN), aluminum oxide (Al2O3), or a combination thereof. Accordingly, it may be possible to prevent an electrical short-circuit that may be created in case that the active layer 330 comes in contact with the first electrode 210 or the second electrode 220. Since the insulation film 381 protects the outer circumferential surface of the light-emitting element 300 including the active layer 330, it may be possible to prevent a decrease in luminous efficiency.

The outer circumferential surface of the insulating film 381 may be surface-treated, so that the binding group 385 may be bonded to at least a part of the surface. The binding group 385 may form a covalent bond with the second insulating layer 520, and can fix the light-emitting elements 300 between the electrodes 210 and 220 in case that the display device 10 is fabricated.

Referring to FIG. 5, the binding group 385 according to an embodiment may have the structure as expressed by Structural Formula 1 below:

L-X—R1                                        <Structural Formula 1> where X denotes main chains 385a, L denotes linkers 385b connected to the main chains 385a and capable of bonding to the surface of the insulation film 381, and R1 denotes a first functional groups 385c connected to the main chain 385a and capable of fixing the light-emitting element 300 by forming a covalent bond with the second insulating layer 520.

The main chains 385a may be the bodies of the binding groups 385, and the linkers 385b and the first functional groups 385c may be bonded thereto. The main chain 385a may include a carbon chain, and its structure is not particularly limited as long as it may not affect the alignment of the light-emitting elements 300. For example, the main chain 385a may be one of a C1-6 alkyl group, a C1-6 alkenyl group, and a C1-6 alkynyl group.

In some embodiments, the main chains 385a may have a resonance structure and may form charges in the molecules by the resonance structure. By the dipoles formed in the molecules by the main chains 385a, the binding groups 385 can increase the dielectric anisotropy of the light-emitting elements 300, and the dielectrophoretic reactivity may increase, so that the degree of alignment of the light-emitting elements 300 between the electrodes 210 and 220 can be improved. In an embodiment, the main chains 385a may have a structure including at least one phenyl group. Specifically, the main chains 385a may be a phenyl group, a biphenyl group, a naphthalene group, etc.

The linkers 385b may be connected to the main chains 385a to form covalent bonds with atoms on the surface of the insulation film 381. The linkers 385b may include binding portions forming covalent bonds with the insulation film 381, and linking portions connecting the binding portions with the main chains 385a.

In an embodiment, the insulation film 381 may include a material such as aluminum oxide (Al2O3), silicon oxide (SiOx), or a combination thereof, and the linkers 385b may include silane groups, boronate groups or the like as the binding portions. For example, the linkers 385b may include —Si(OH)3, —Si(OR)3, —(R)Si(OH)3, —(R)Si(OR)3, —B(OH)2, —B(OR)2, —(R)B(OH)2 and —(R)B(OR)2. The R may include a carbon chain including carbon and hydrogen. It is, however, to be understood that the disclosure is not limited thereto. Since the silane group and the boronate group can form a covalent bond with the oxygen atom (O) present on the surface of the insulation film 381, the binding group 385 can be coupled with the insulation film 381 by the linker 385b.

The linker 385b may include an alkyl group, an alkenyl group, or an alkynyl group having 1 to 6 carbon atoms as the binding portion. In other words, the linker 385b may include a carbon chain having a single bond as the binding portion. The carbon chain having a single bond may be capable of single bond rotation, so that the binding group 385 bonded by the linker 385b may be oriented in random directions.

The first functional groups 385c may form a bond, for example, a covalent bond, with the second functional groups 521 included in the second insulating layer 520 as described later. The covalent bond between the first functional groups 385c and the second functional groups 521 can fix the light-emitting element 300 on the second insulating layer 520.

In an embodiment, each of the first functional groups 385c and the second functional groups 521 may be a nucleophilic functional group or an electrophilic functional group, and in some cases, may be a functional group forming cycloaddition. For example, the first functional groups 385c and the second functional groups 521 are not particularly limited as long as they have structures capable of forming covalent bonds, and it is not necessary that one of the first functional groups 385c and the second functional groups 521 has to be a nucleophile or an electrophile.

For example, the first functional groups 385c and the second functional groups 521 may include an alcohol group, an alkylamine group, etc. as a nucleophilic functional group, and an acrylate group, an epoxy group, etc. as an electrophilic functional group.

In case that the display device 10 may be fabricated, the aligned positions of the light-emitting elements 300 may be changed arbitrarily. In particular, in case that a coating solution S in which the light-emitting elements 300 are dispersed may be volatilized, the alignment of the light-emitting elements 300 may be changed. In contrast, according to an embodiment, the light-emitting elements 300 may form covalent bonds with the second insulating layer 520, and thus it may be possible to reduce a change in the alignment of the light-emitting elements 300 fixed at their respective positions.

Figure 6:
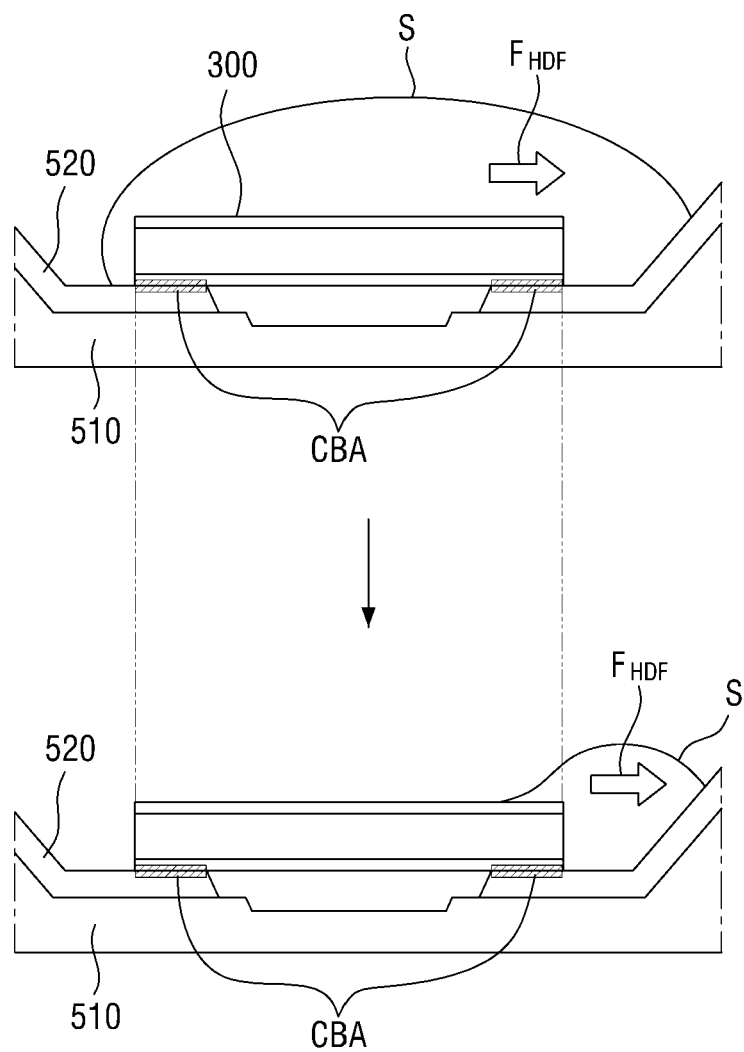
FIGS. 6 to 7 are views schematically showing some processing steps of a method of fabricating a display device according to an embodiment of the disclosure.
Figure 7:
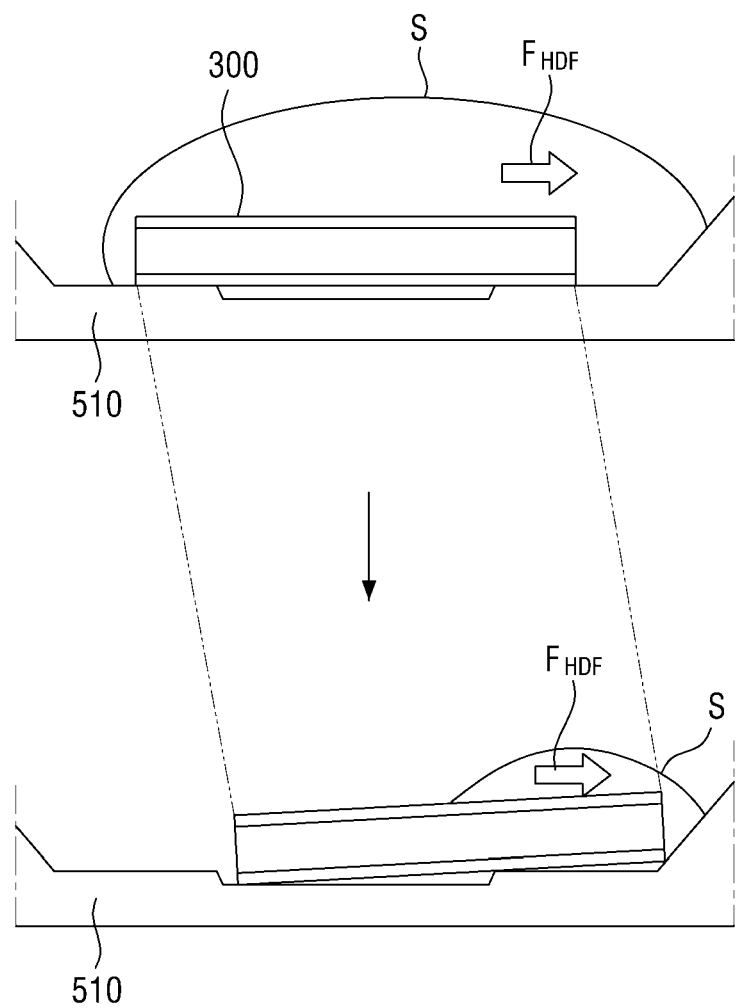

FIGS. 6 to 7 are views schematically showing some processing steps of a method of fabricating a display device according to an embodiment of the disclosure.

Referring to FIGS. 6 and 7, the display device 10 may be fabricated by forming a second insulating layer 520 and aligning a light-emitting element 300 thereon. The light-emitting element 300 dispersed in the coating solution S may be applied on the electrodes 210 and 220. In case that power is applied to each of the electrodes 210 and 220, the light-emitting element 300 may be aligned by a dielectrophoretic (DEP) force. A more detailed description thereon will be given later.

The coating solution S may be a solvent in which the light-emitting elements 300 may be dispersed. The coating solution S may have a formulation such as ink and paste, and may be one or more of acetone, water, alcohol, and toluene. It is, however, to be understood that the disclosure is not limited thereto. The coating solution S is not particularly limited as long as it can be vaporized at room temperature or by heat.

The coating solution S may be volatilized at non-uniform rates from region to region, in which case a hydrodynamic force $F_{HDF}$ may be applied between the regions. The positions of the light-emitting elements 300 dispersed in the coating solution S may be moved by hydrodynamic force $F_{HDF}$.

If the light-emitting elements 300 are aligned on (e.g., directly on) the first insulating layer 510 without the second insulating layer 520, the light-emitting elements 300 may be aligned on the first insulating layer 510 while not being fixed thereon. Accordingly, the position of the light-emitting element 300 may be moved by the hydrodynamic force FHDF which may be applied in case that the coating solution S may be volatilized, an end of the light-emitting element 300 may be electrically separated from the first electrode 210 or the second electrode 220. Accordingly, in the display device 10 fabricated without the second insulating layer 520, the degree of the alignment of the light-emitting element 300 may be poor, and thus any of the pixels PX may fail to emit light.

In contrast, in case that the second insulating layer 520 is formed on the first insulating layer 510 and the light-emitting element 300 is aligned, the first functional groups 385c of the light-emitting element 300 and the second functional groups 521 of the second insulating layer 520 may form chemical bonds, e.g., covalent bonds, to fix the light-emitting element 300. The covalent bond formed between the first functional groups 385c of the light-emitting element 300 and the second functional groups 521 of the second insulating layer 520 can prevent the light-emitting element 300 from moving by the hydrodynamic force FHDF.

As shown in FIG. 6, in a region where the light-emitting element 300 may be in contact with the second insulating layer 520, the light-emitting element 300 and the second insulating layer 520 may be bonded with each other to form a covalent bond area CBA. In the covalent bond area CBA, the first functional groups 385c of the light-emitting element 300 and the second functional groups 521 of the second insulating layer 520 may form covalent bonds. For example, the region where the second insulating layer 520 and the light-emitting element 300 may be in contact with each other may include at least a part of the covalent bond area CBA, and the covalent bond area CBA may contain the covalent bonds formed by the first functional groups 385c and the second functional groups 521. The covalent bonds may have a relatively strong binding energy among chemical bonds that can be formed between the first functional groups 385c and the second functional groups 521. Accordingly, the light-emitting element 300 can be fixed on the second insulating layer 520 by the covalent bonds.

The covalent bonds formed between the first functional groups 385c and the second functional groups 521 may be stronger than the hydrodynamic force FHDF. The light-emitting element 300 can hold its initial position with respect to the covalent bond area CBA between the light-emitting element 300 and the second insulating layer 520 even though the coating solution S may be volatilized and thus the hydrodynamic force FHDF may be applied. Accordingly, the light-emitting elements 300 can be aligned highly uniformly in each of the pixels PX of the display device 10, and reliability for different pixels PX of the display device 10 can be improved.

In some embodiments, the outer circumferential surface of the insulation film 381 of the insulating material film 380 may be further surface-treated with other materials. As described above, in case that the light-emitting elements 300 may be aligned between the electrodes 210 and 220, the light-emitting elements 300 dispersed in the solution may be applied. In doing so, a surface treatment may be applied to the insulation film 381 so that it becomes hydrophobic or hydrophilic in order to keep the light-emitting elements 300 dispersed in the ink from gathering together. Accordingly, the light-emitting elements 300 can remain dispersed in the solution. In this manner, the light-emitting elements 300 can be aligned between the first electrode 210 and the second electrode 220 without gathering together.

The light-emitting element 300 may be cylindrical. Accordingly, a cross section taken along the longitudinal direction traversing both ends of the light-emitting element 300 may have a quadrangular shape. It is to be understood that the shape of the light-emitting element 300 is not limited thereto but may have various shapes such as a cube, a cuboid and a hexagonal column. The length l of the light-emitting element 300 may range from about 1 μm to about 10 μm or from about 2 μm to about 5 μm. In an embodiment, the length l of the light-emitting element 300 may be approximately 4 μm. The diameter of the light-emitting element 300 may range from about 400 nm to about 700 nm, and in an embodiment, be approximately 500 nm.

Hereinafter, a method of fabricating a display device 10 according to an embodiment of the disclosure will be described. Hereinafter, some of the processing steps of the method of fabricating the display device 10 will be described with respect to the drawings. It is, however, to be understood that other processing steps may be further performed. Hereinafter, a process of aligning the light-emitting elements 300 of the method of fabricating the display device 10 will be described in detail.

FIGS. 8 to 13 are schematic cross-sectional views showing some processing steps of a method of fabricating a display device according to an embodiment of the disclosure.

Figure 8:
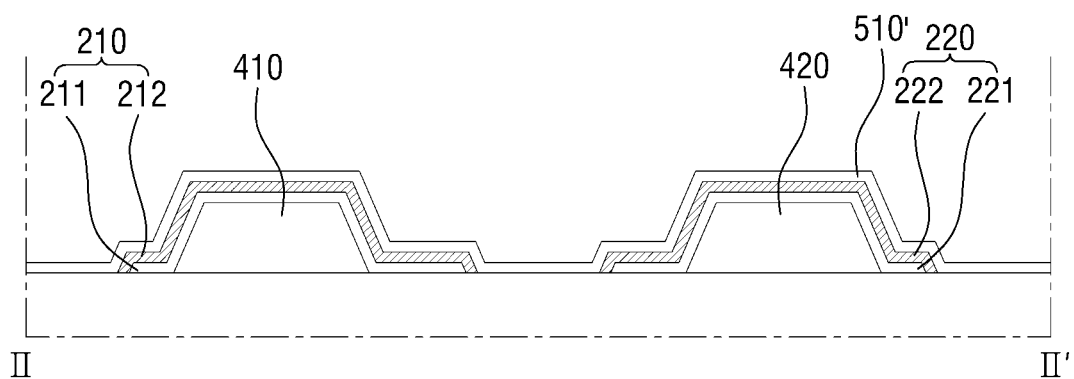
FIGS. 8 to 13 are schematic cross-sectional views showing some processing steps of a method of fabricating a display device according to an embodiment of the disclosure.

Initially, referring to FIG. 8, a lower substrate may be prepared, which includes an insulating substrate layer 200, a first bank 410 and a second bank 420 disposed on the insulating substrate layer 300 and spaced apart from each other, a first electrode 210 and a second electrode 220 disposed on the first bank 410 and the second bank 420, respectively, and a first insulating material layer 510' disposed to cover the electrodes. The above elements may be formed by performing a typical mask process to pattern a metal or an organic material. In the following description, a process or method of forming each of the elements will not be described. For convenience of illustration, the elements disposed under the insulating substrate layer 200, e.g., the first thin-film transistor 120, the second thin-film transistor 140, and the power supply line 161 will not be depicted in the drawings.

The first insulating material layer 510' may be disposed to cover the entire upper surfaces of the first electrode 210 and the second electrode 220. The first insulating material layer 510' may be partially patterned during a process described later after the light-emitting elements 300 have been aligned, to form the first insulating layer 510.

Figure 9:
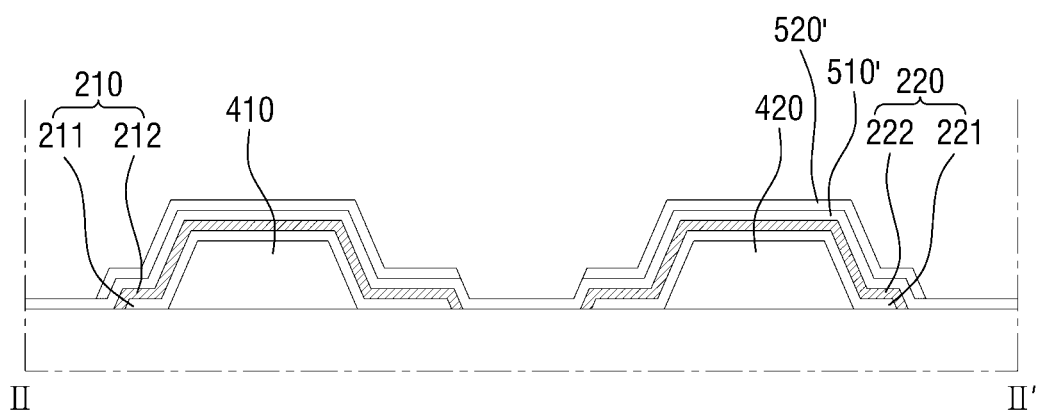

Subsequently, referring to FIG. 9, a second insulating material layer 520' may be patterned on the first insulating material layer 510'. The second insulating material layer 520' may include the second functional groups 521 capable of forming a chemical bond, e.g., a covalent bond with the first functional groups 385c of the light-emitting element 300.

The second insulating material layer 520' may be disposed on the first insulating material layer 510' but may overlap the first electrode 210 and the second electrode 220. In other words, the second insulating material layer 520' may substantially cover the first electrode 210 and the second electrode 220. The second insulating material layer 520', like the first insulating material layer 510', may be partially patterned during a process described below to form the second insulating layer 520.

In case that the display device 10 is fabricated, an area where the second insulating material layer 520' may be disposed may not be limited thereto. In some implementations, the second insulating material layer 520' may cover only the inclined side surfaces of the first electrode 210 and the second electrode 220, and may also be disposed between the first electrode 210 and the second electrode 220 separated from each other. More detailed description thereon will be made below with reference to the other drawings.

Subsequently, referring to FIG. 10, the coating solution S in which the light-emitting elements 300 may be dispersed may be applied on the second insulating material layer 520', and an electric field E may be formed between the first electrode 210 and the second electrode 220 to align the light-emitting elements 300. As described above, the light-emitting elements 300 may be aligned between the electrodes 210 and 220 by the dielectrophoresis technique. Dielectrophoretic force may be applied to the light-emitting elements 300 dispersed in the coating solution S by the electric field E formed between the first electrode 210 and the second electrode 220. Accordingly, the light-emitting elements 300 may be aligned so that both ends of the light-emitting elements 300 may overlap the first electrode 210 and the second electrode 220, respectively.

The coating solution S may be applied by using a variety of processes including, but not limited to, inkjet printing, inkjet injection, slot-die coating, slot-die printing, etc.

Figure 10:
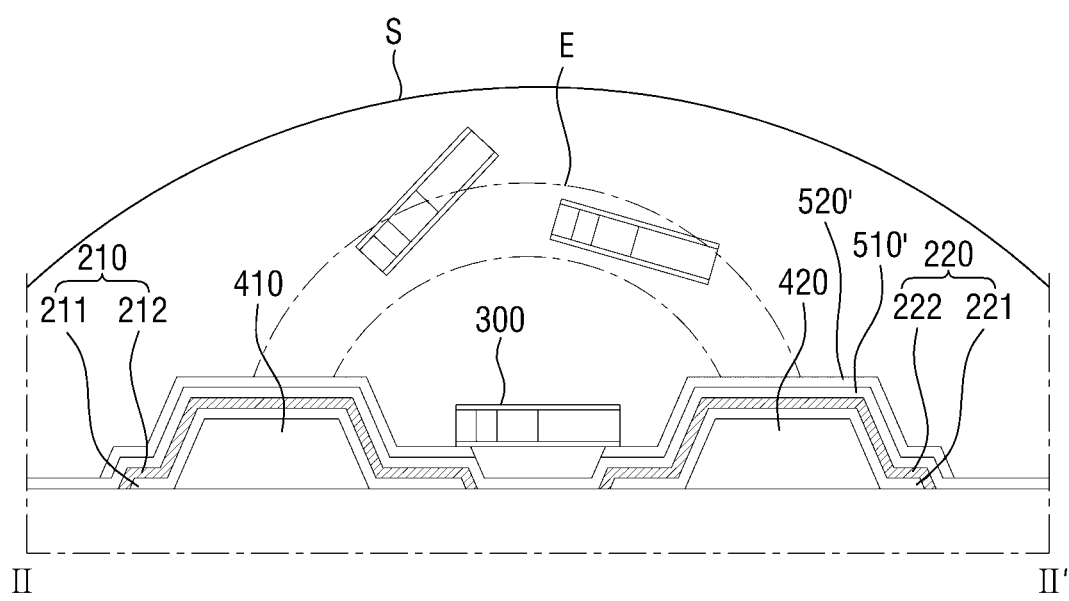

FIG. 10 shows that one first electrode 210 and one second electrode 220 may be formed on two banks 410 and 420, respectively. It is, however, to be understood that the coating solution S can be applied in the same manner even in case that a first electrode 210 may be further disposed on another bank like in the example shown in FIG. 1.

Figure 11:
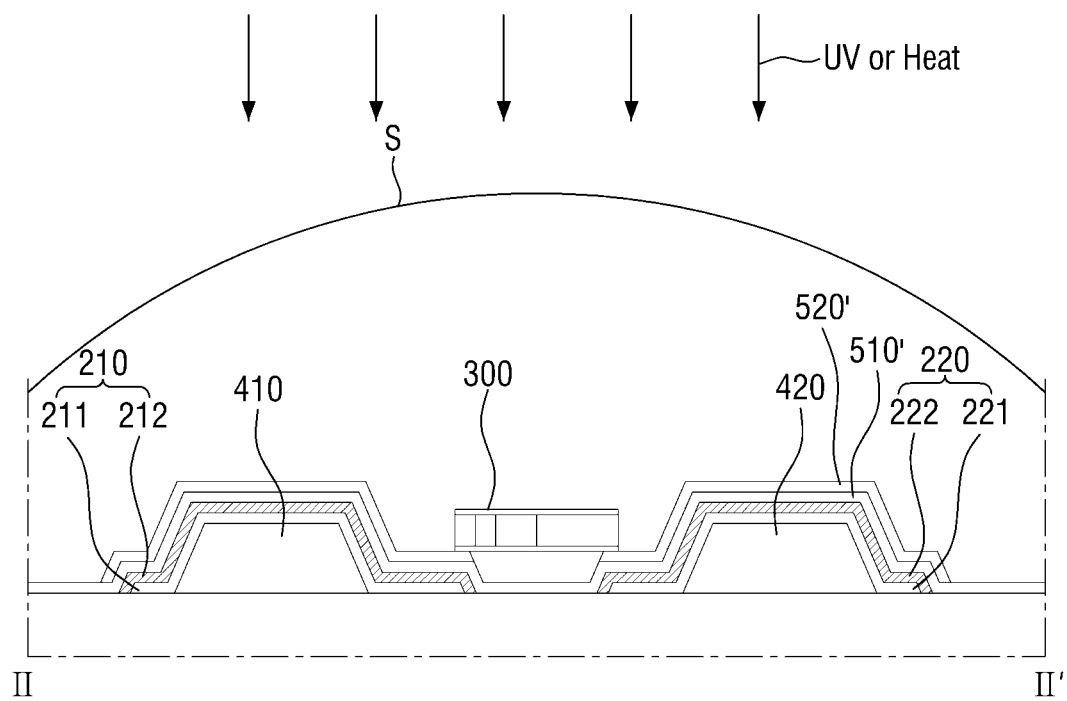
Figure 12:
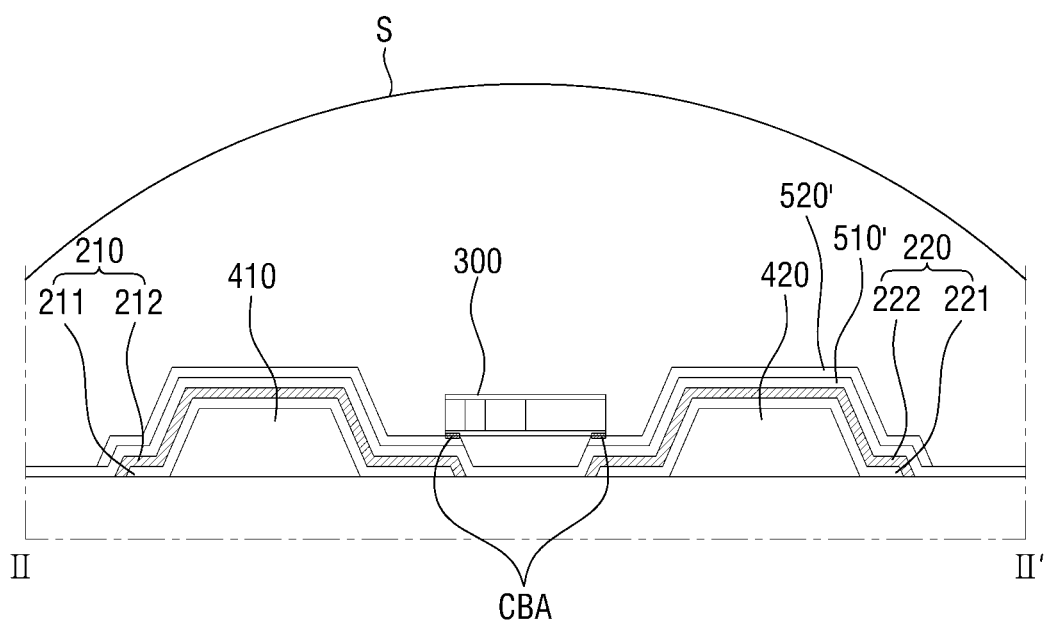

Subsequently, referring to FIGS. 11 and 12, after aligning the light-emitting elements 300, a process of irradiating ultraviolet rays or heat treatment to the coating solution S may be performed. Before removing the coating solution S by volatilizing it, the first functional groups 385c of the light-emitting element 300 and the second functional groups 521 of the second insulating material layer 520' may be bonded to each other by the ultraviolet rays or the heat treatment. As described above, the first functional groups 385c and the second functional groups 521 may form covalent bonds through a nucleophile-electrophile reaction, cycloaddition reaction, etc. Accordingly, the area where the light-emitting element 300 may be in contact with the second insulating material layer 520' may be a covalent bond area CBA containing covalent bonds of the first functional groups 385c and the second functional groups 521. By forming the covalent bond area CBA, the light-emitting element 300 can hold its initially aligned position on the second insulating material layer 520'.

Figure 13:
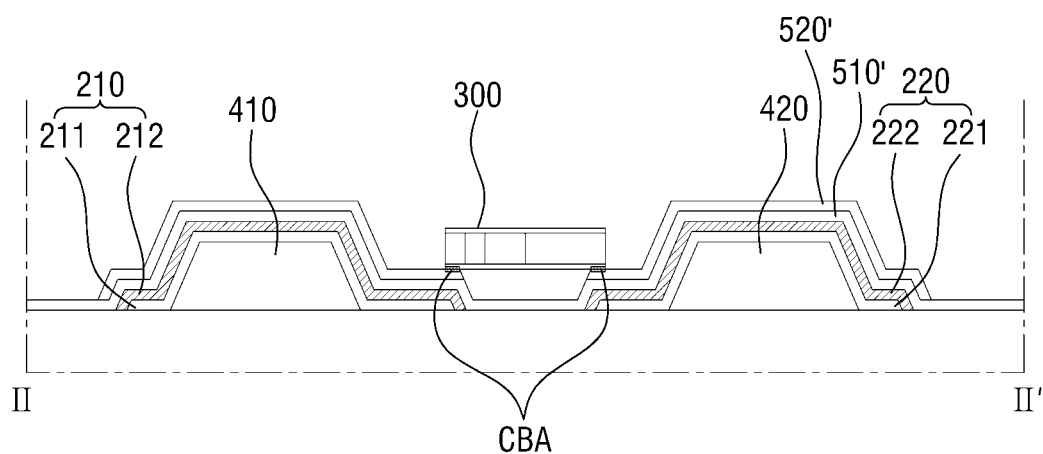

Subsequently, referring to FIG. 13, the coating solution S may be removed by volatilizing it. The light-emitting element 300 fixed on the second insulating material layer 520' can hold its aligned initial position even in case that the hydrodynamic force may be applied in case that the coating solution S may be volatilized.

Although not shown in the drawings, the elements described above, such as the third insulating layer 530, the contact electrodes 260, the fourth insulating layer 540 and the passivation layer 550, may be formed via additional processes thereafter, to fabricate the display device 10. In particular, in order to bring the contact electrodes 260 into contact with the first electrode 210 and the second electrode 220, the first insulating material layer 510' and the second insulating material layer 520' may be partially removed. As a result, the first insulating layer 510 and the second insulating layer 520 of FIG. 2 can be formed.

Accordingly, in case that the display device 10 may be fabricated, the light-emitting elements 300 can be aligned between the first electrode 210 and the second electrode 220 highly correctly. By improving the alignment of the light-emitting elements 330, it may be possible to reduce connection or contact failures between the electrodes 210 and 220 or the contact electrodes 260, and to improve the reliability of each of the pixels PX of the display device 10.

Hereinafter, display devices according to other embodiments will be described with reference to FIGS. 14 to 21. FIGS. 14 to 21 illustrate partial structures of the display devices for convenience of illustration. In particular, structures of second insulating layers formed in the display devices will be described in detail.

In the display device 10 of FIGS. 1 and 2, the second insulating layer 520 may be disposed to cover the electrodes 210 and 220 or the electrode branches 210B and 220B, and the second insulating layer 520 may be patterned so that the electrodes 210 and 220 or the electrode branches 210B and 220B may be partially exposed. For example, the process of removing the second insulating layer 520 may be carried out so that the electrodes 210 and 220 and the contact electrodes 260 may be in contact with each other. It is, however, to be understood that the disclosure is not limited thereto.

FIGS. 14 to 22 are schematic plan views and cross-sectional views of display devices according to other embodiments.

Figure 14:
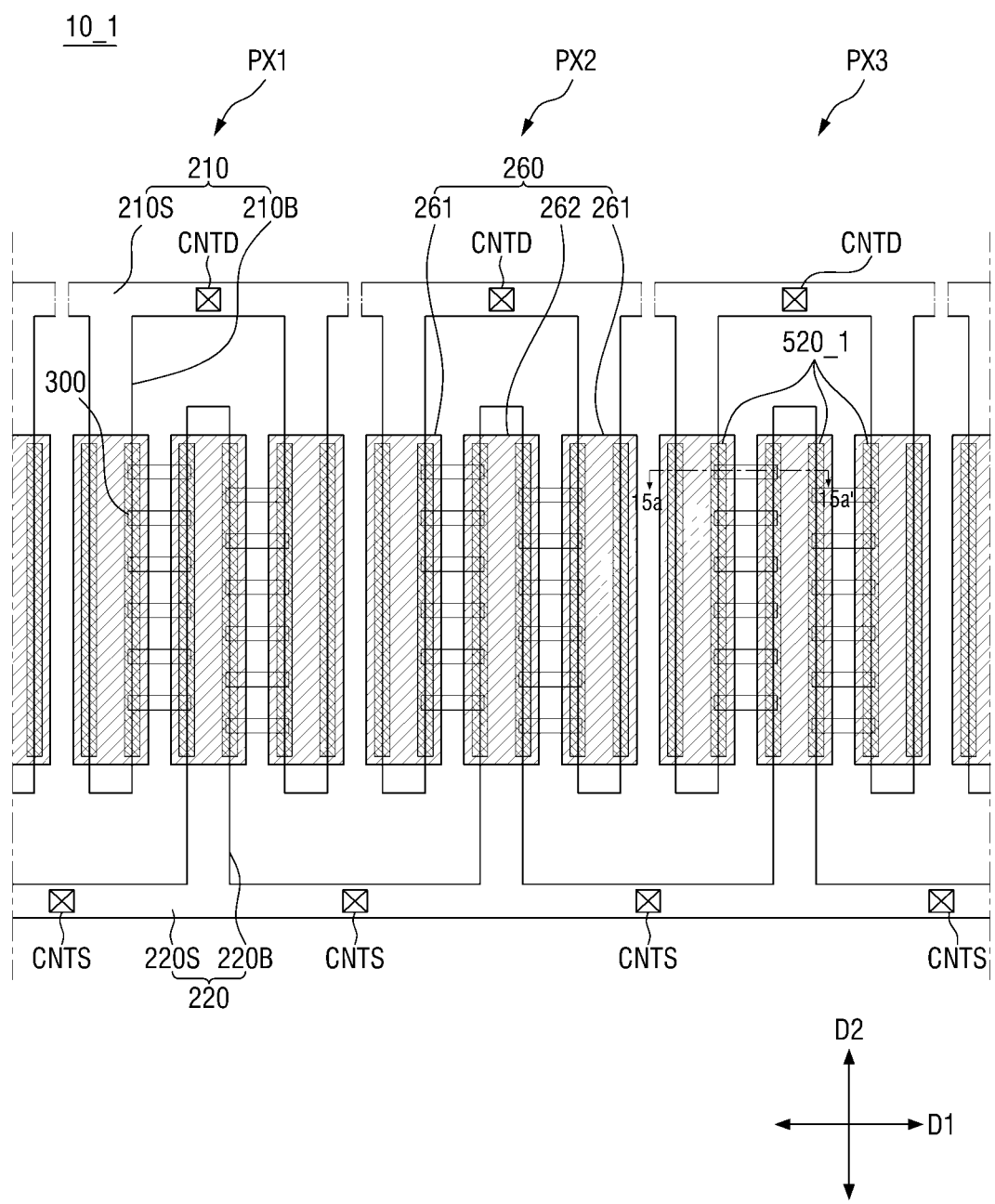
FIGS. 14 to 22 are schematic plan views and cross-sectional views of display devices according to other embodiments.

First, referring to FIG. 14, in a display device 10_1, a second insulating layer 520_1 may be disposed so that it covers only both side portions of each of the electrode branches 210B and 220B. In other words, unlike the second insulating layer 520 of FIG. 1, the second insulating layer 520_1 of FIG. 14 may be disposed on each of the electrode branches 210B and 220B so that ends in the second direction DR2 may not be connected to each other.

In other words, the second insulating layer 520_1 may include first insulating patterns overlapping the first electrode branch 210B and extended in the second direction DR2, and second insulating patterns overlapping the second electrode branch 220B and extended in the second direction DR2. The first insulating patterns may be spaced apart from the second insulating patterns in the first direction D1. The first and second insulating patterns may overlap both side portions of the first electrode branch 210B and the second electrode branch 220B, respectively.

The structure of the second insulating layer 520_1 may be formed by depositing materials of the second insulating layer 520_1 along the direction in which the electrode branches 210B and 220B may be extended. The second insulating layer 520_1 may be formed so as not to cover the entirely the upper surfaces of the electrodes 210 and 220 or the electrode branches 210B and 220B. Accordingly, in case that a part of each of the electrodes 210 and 220 may be exposed and may be brought into contact with the contact electrodes 260, the second insulating layer 520_1 may not be patterned.

Figure 15:
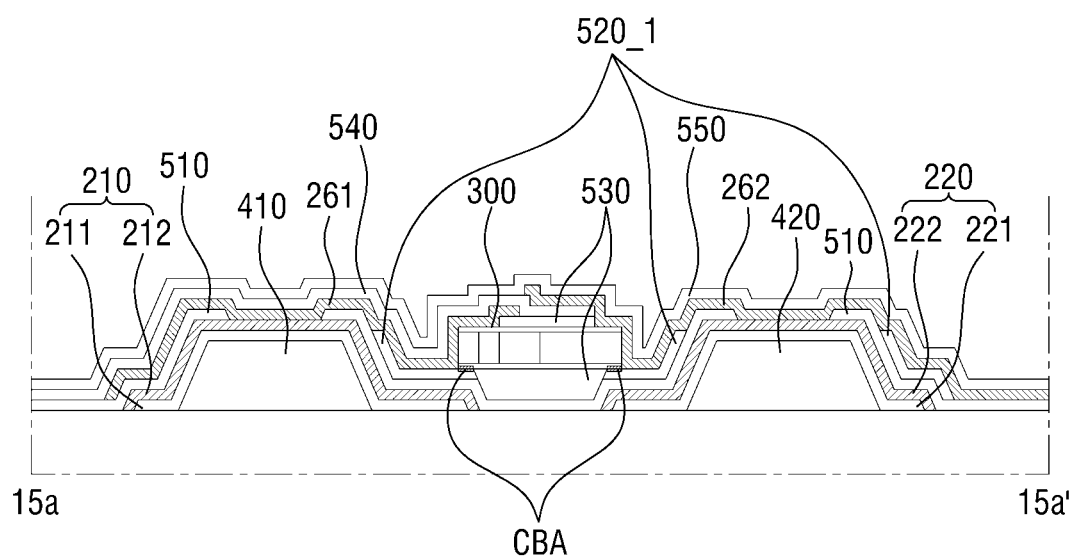

FIG. 15 is a cross-sectional view taken along line 15*a*-15*a'* of FIG. 14. Referring to FIG. 15, the second insulating layer 520_1 may not be disposed on the upper surfaces of the first electrode 210 and the second electrode 220, and may be disposed so that it overlaps the inclined side surfaces of the electrodes 210 and 220. A light-emitting element 300 may be in contact with a part of the second insulating layer 520_1, e.g., on a substantially flat area on the first insulating layer 510. In the area where the light-emitting element 300 may be in contact with the second insulating layer 520_1, the first functional groups 385*c* of the light-emitting element 300 and the second functional groups 521 of the second insulating layer 520_1 may form a bond. In the area where the light-emitting element 300 may be in contact with the second insulating layer 520_1, the first functional groups 385*c* and the second functional groups 521 form a covalent bond, so that a covalent bond area CBA may be located. The covalent bond area CBA may be located adjacent to each of the both side portions of the lower surface of the light-emitting element 300.

Figure 16:
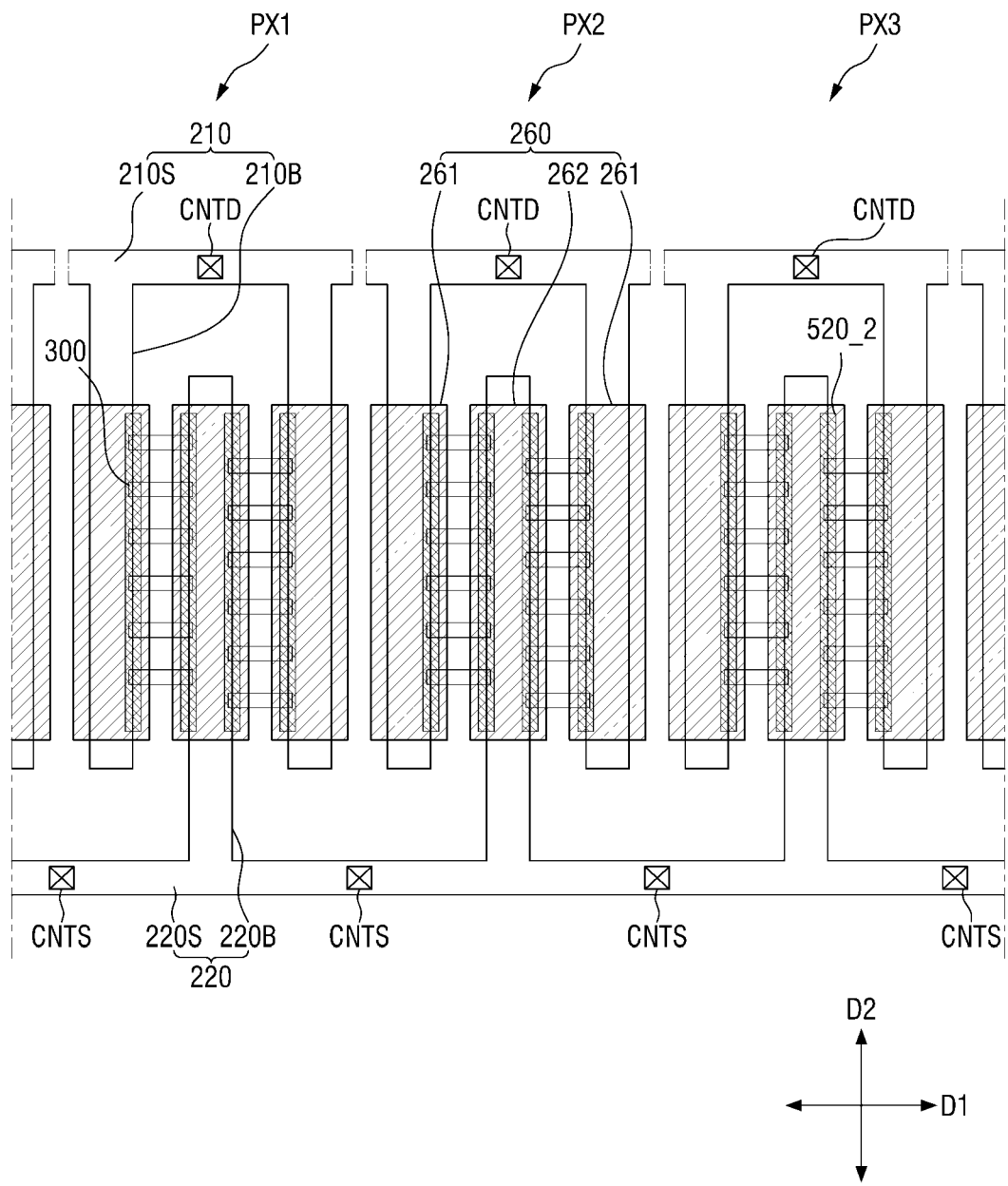

Referring to FIG. 16, in a display device 10_2 according to another embodiment, a second insulating layer 520_2 may be disposed so that it overlaps only one side portion of some of the electrode branches 210B and 220B. The light-emitting elements 300 may be aligned between the first electrode branches 210B and the second electrode branches 220B, and the light-emitting elements 300 may not be aligned on one of the side portions of each of the first electrode branches 210B that may be opposite to the second electrode branch 220B. As the second insulating layer 520_2 may not be disposed on the side portion of each of the first electrode branches 210B, the light-emitting elements 300 may not be aligned there. It is, however, to be understood that the second insulating layer 520_2 is not necessarily disposed on only one side portion of each of the first electrode branches 210B. In some implementations, the second insulating layer 520_2 may overlap only one side portion of the second electrode branch 220B. For example, the second insulating layer 520_2 may be formed selectively on the portions where light-emitting elements 300 may be aligned.

For example, the second insulating layer 520 may be disposed on the first electrodes branch 210B and the second electrode branch 220B on which the light-emitting elements 300 may be aligned, or between the first electrodes 210 and the second electrode 220 spaced apart from each other.

Figure 17:
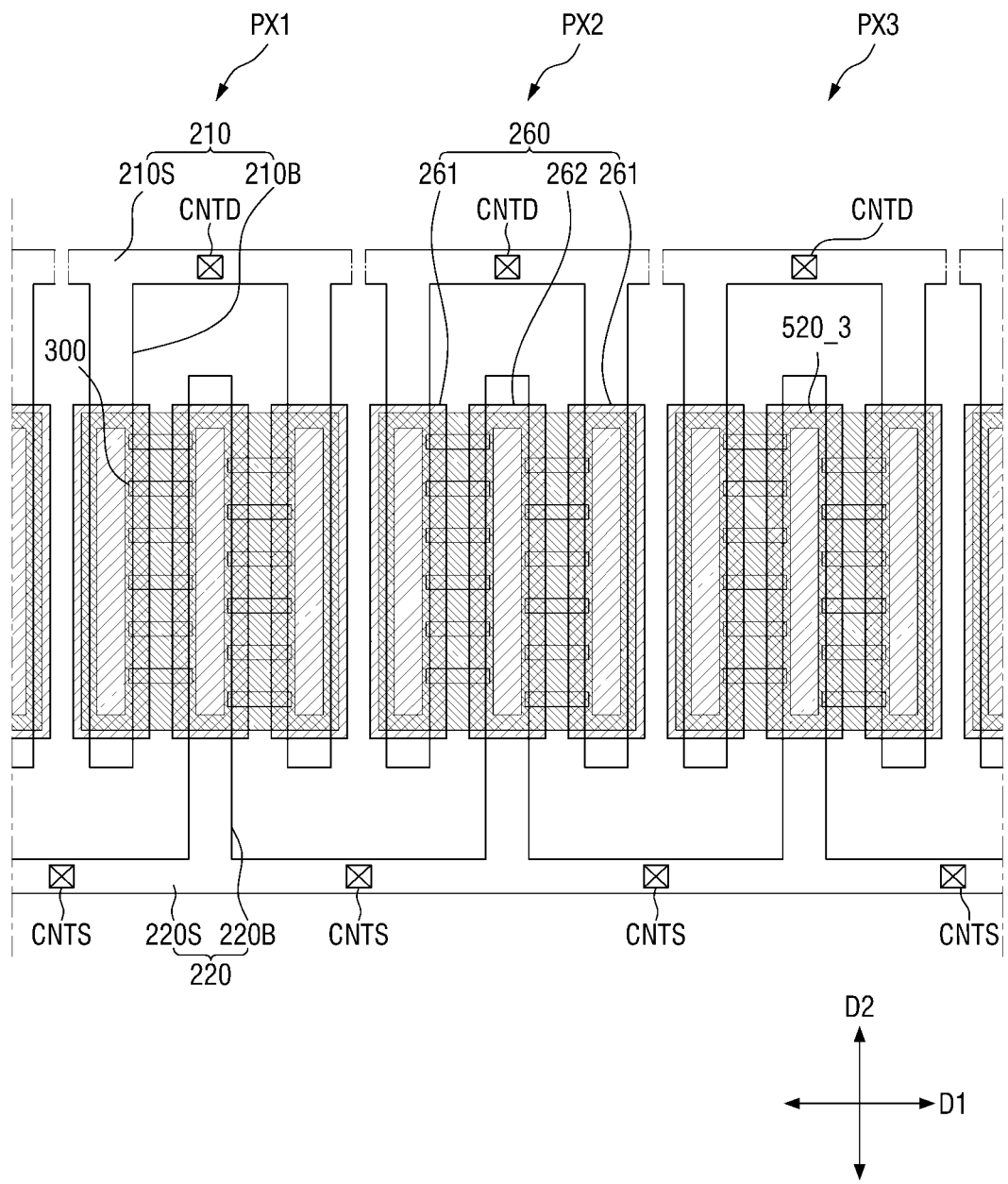
Figure 18:
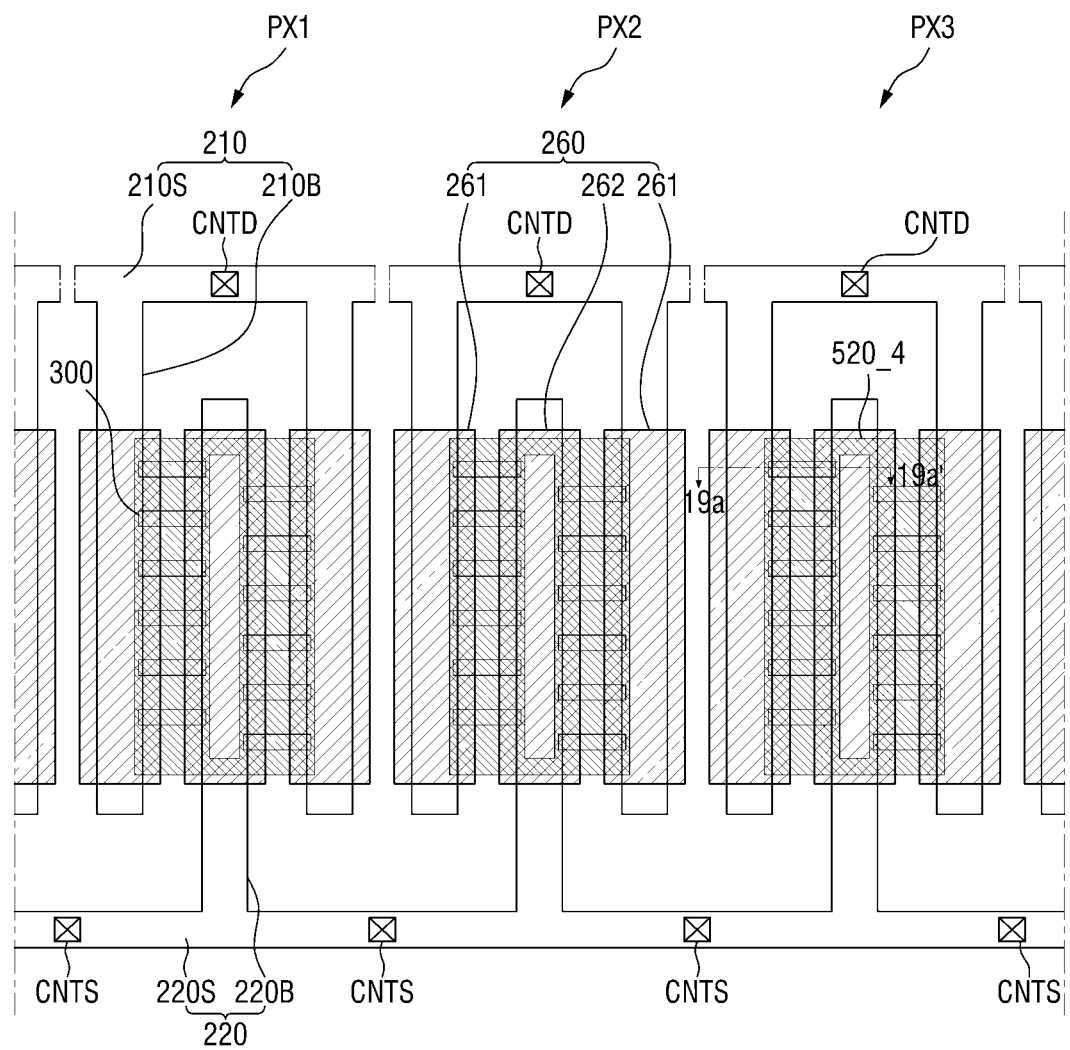
Figure 19:
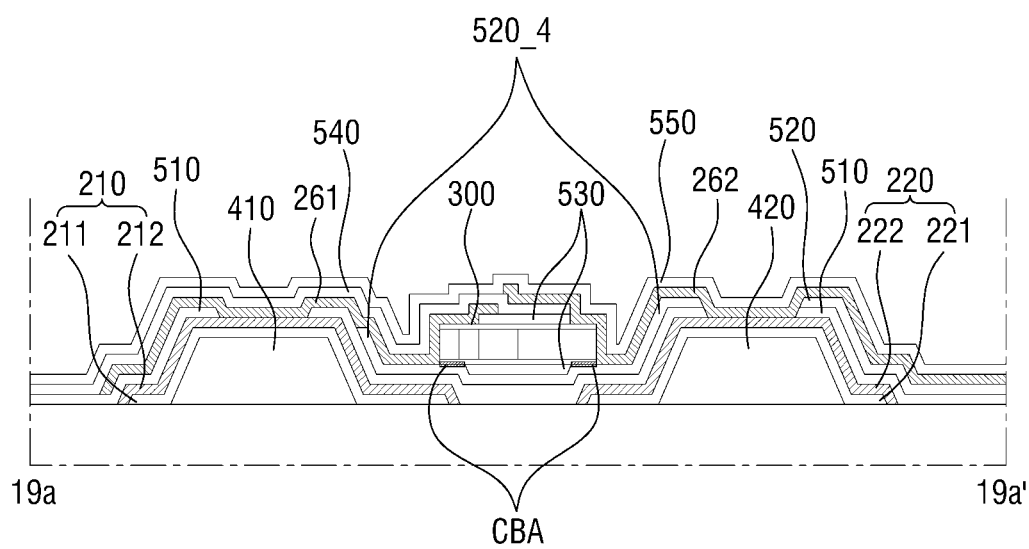
Figure 20:
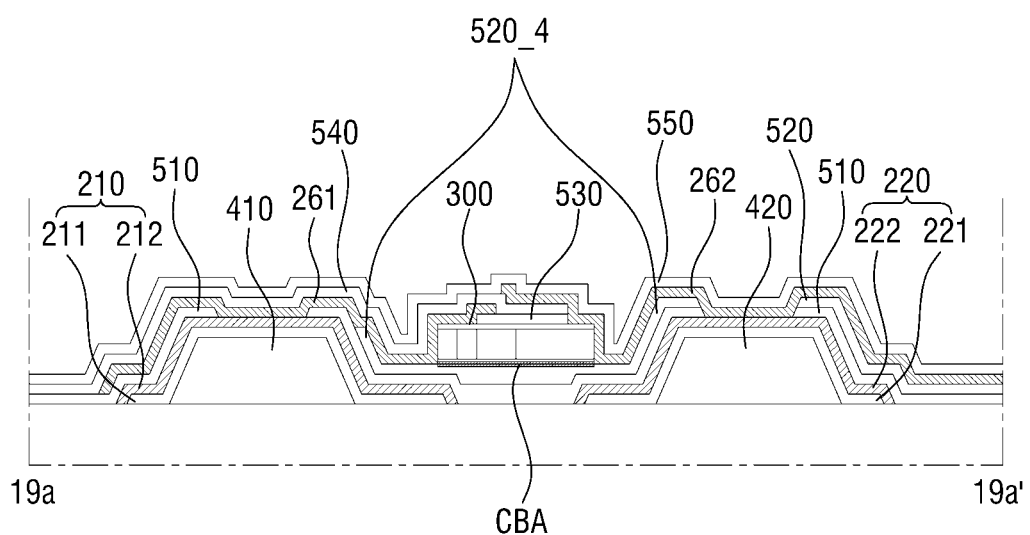

FIGS. 17 and 18 are schematic plan views showing structures of second insulating layers according to yet other embodiments. FIG. 19 is a schematic cross-sectional view taken along line 19*a*-19*a'* of FIG. 18. FIG. 20 is a schematic cross-sectional view showing a modification of the embodiment of FIG. 19.

Referring to FIG. 17, in a display device 10_3, a second insulating layer 520_3 may partially cover the electrode branches 210B and 220B and may also be disposed in the space therebetween. Referring to FIG. 18, in a display device 10_4, a second insulating layer 520_4 may be disposed in the space between the electrode branches 210B and 220B spaced apart from each other, but may not cover in the portions where the light-emitting elements 300 may not be aligned, e.g., one side portion of each of the first electrode branches 210B. The description made with reference to FIG. 16 is equally applied hereto. Accordingly, the second insulating layers 520_3 and 520_4 may be formed in a single pattern in each of the pixels PX, and may be connected between the electrode branches 210B and 220B.

Although not shown in the drawings, the second insulating layers 520_3 and 520_4 may be disposed in the space between the electrode branches 210B and 220B, but both side portions in the second direction D2 may not be connected to each other as in FIG. 14. Unlike FIGS. 17 and 18, the second insulating layers 520_3 and 520_4 may have a structure in which patterns may be disposed in each of the pixels PX, and the width measured in the first direction D1 may be different.

Such a structure of the second insulating layers 520_3 and 520_4 may be formed by forming the second insulating layers 520_3 and 520_4 so that they cover the entire area including the first electrode branches 210B, the second electrode branches 220B and the space therebetween, and patterning the second insulating layers 520_3 and 520_4 so that the centers of the electrode branches 210B and 220B may be exposed.

Referring to FIG. 19, the second insulating layer 520_4 of FIG. 18 may not be disposed on the upper surface of the first electrode 210 but may be disposed on the inclined side surface of the first electrode 210 to overlap the inclined side surface of the first electrode 210. The second insulating layer 520_4 may be disposed on the upper surface of the second electrode 220 to partially overlap the upper surface of the second electrode, and may have substantially the same shape as the first insulating layer 510 patterned for contact with the contact electrodes 260. Accordingly, a covalent bond area CBA formed in contact with the second insulating layer 520_4 may be located on each of the end portions of the lower surface of the light-emitting element 300.

In some implementations, the second insulating layer 520_4 may be formed to overlap the entire lower surface of the light-emitting element 300. Referring to FIG. 20, since the second insulating layer 520_4 may also be disposed in the space between the first electrode 210 and the second electrode 220, the contact area between the second insulating layer 520_4 and the lower surface of the light-emitting element 300 can be increased. The first functional groups 385c of the light-emitting element 300 and the second functional groups 521 of the second insulating layer 520_4 can form a greater number of bonds, and thus a wider covalent bond area CBA can be formed. For example, the covalent bond area CBA may be located so that it overlaps the entire lower surface of the light-emitting element 300. Such a structure of the second insulating layer 520_4 may be formed to have different thicknesses at some portions by using a halftone mask or a slit mask.

Figure 21:
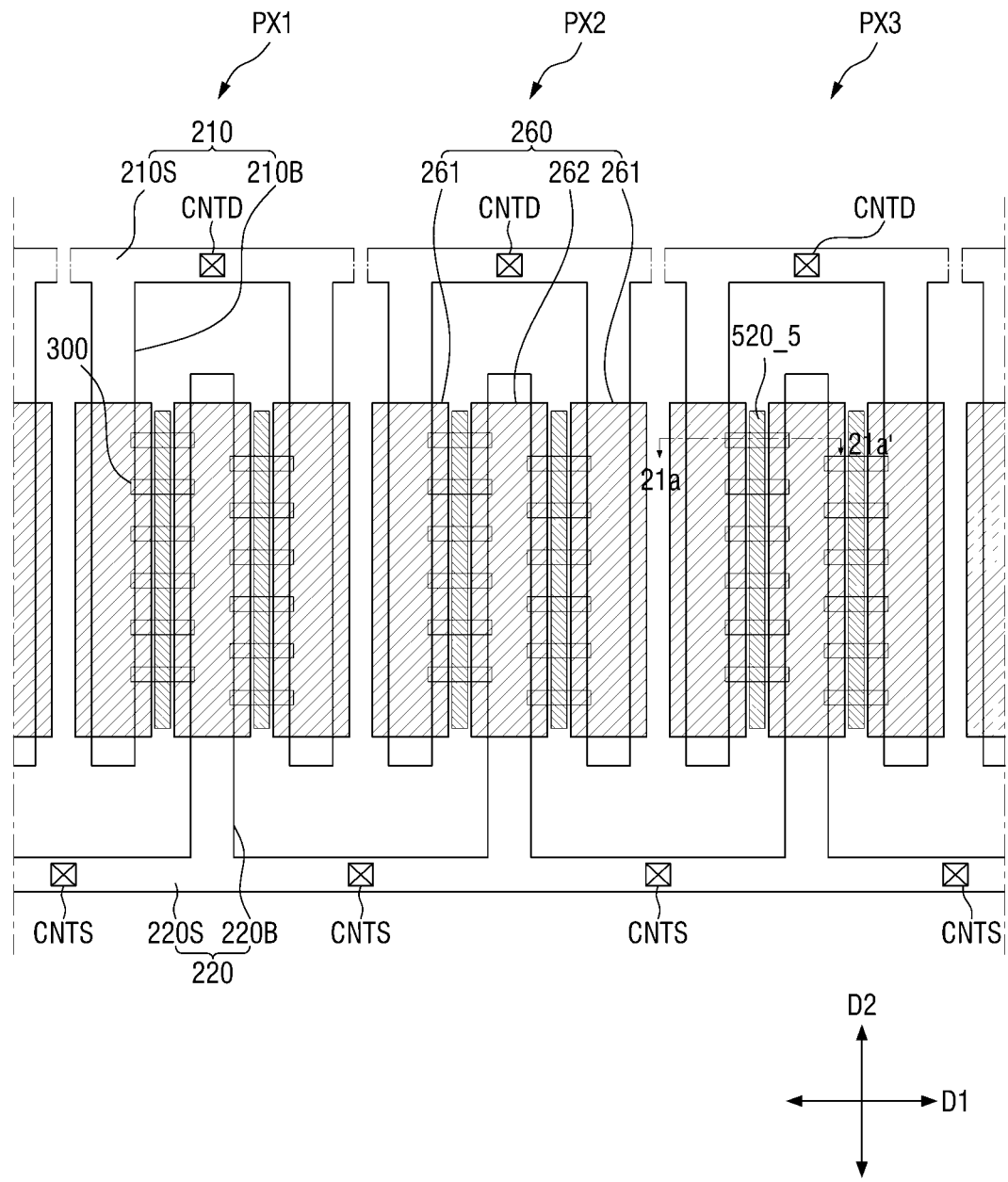

Referring to a display device 10_5 in FIG. 21, the second insulating layer 520_5 may be disposed only in the space between the electrode branches 210B and 220B. For example, the second insulating layer 520_5 may include a third insulating pattern extended in the second direction D2, in which the first electrode branch 210B and the second electrode branch 220B may be extended. There may be third insulating patterns, which may be spaced apart from one another in the first direction D1. Like the first insulating layer 510, the third insulating pattern may be disposed to have an island shape or a linear shape along the space between the first electrode branch 210B and the second electrode branch 220B when viewed from the top.

Figure 22:
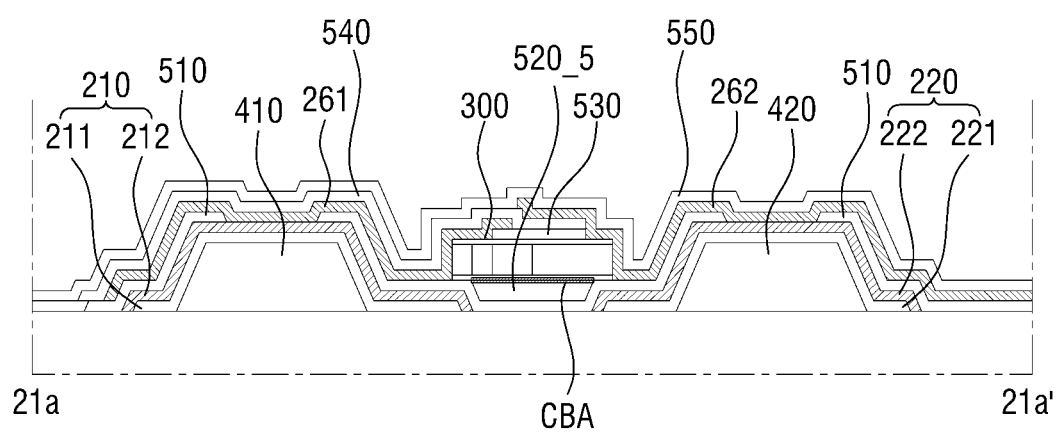

FIG. 22 is a schematic cross-sectional view taken along line 21a-21a' of FIG. 21. Referring to FIG. 22, the second insulating layer 520_5 may be disposed only between the first insulating layer 510 and the lower surface of the light-emitting element 300. The entire area of the second insulating layer 520_5 may be in contact with the lower surface of the light-emitting element 300, and the second insulating layer 520_5 can reduce a level difference that may be created by the first insulating layer 510. The light-emitting element 300 may form a bond with the second insulating layer 520_5 in the central portion of the light-emitting element 300, instead of both end portions of the light-emitting element 300. In other words, a covalent bond area CBA may be located at the central portion of the lower surface of the light-emitting element 300.

Figure 23:
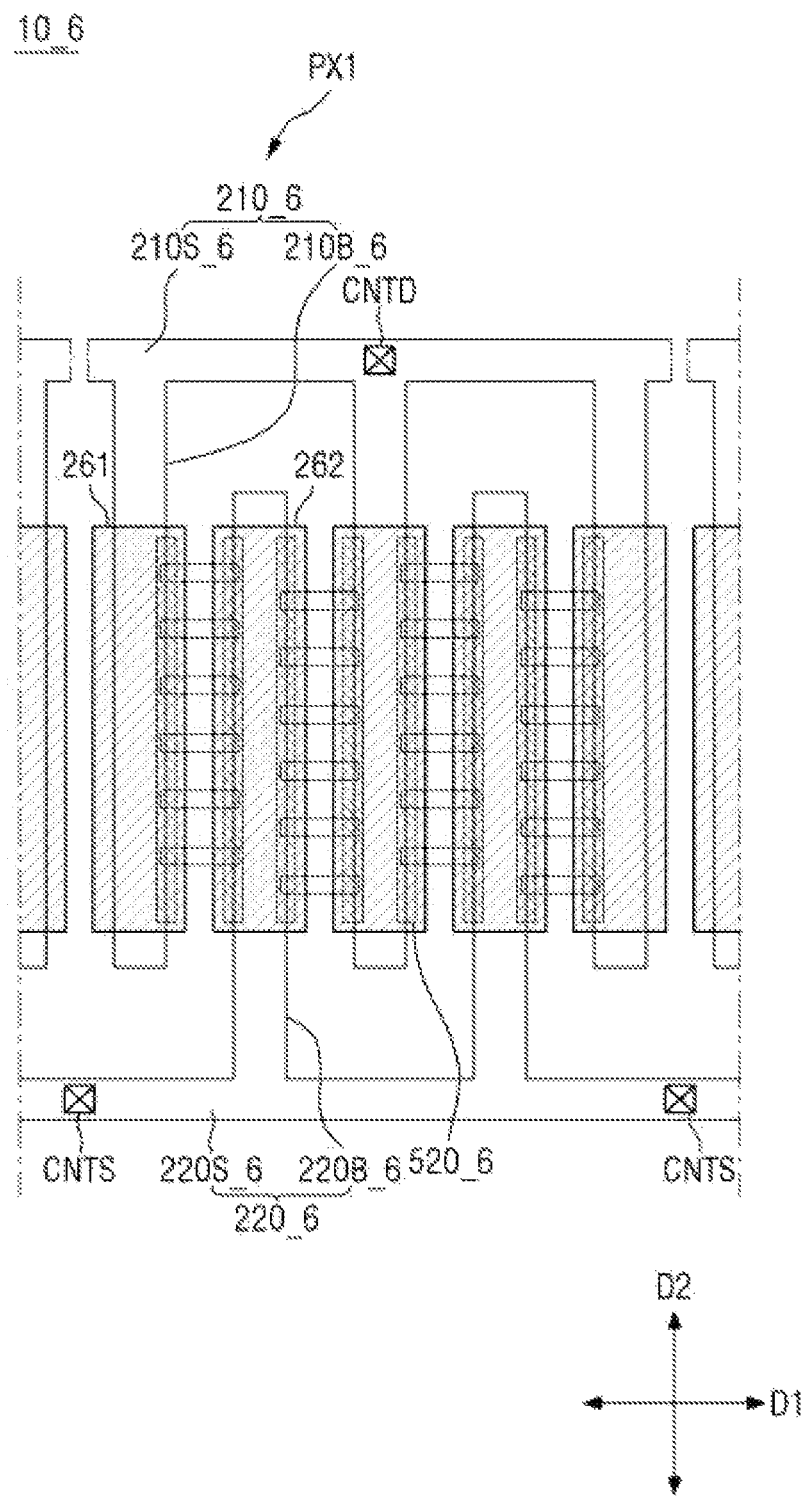
FIG. 23 is a schematic plan view of a display device according to yet another embodiment of the disclosure.

FIG. 23 is a schematic plan view of a display device 10_6 according to yet another embodiment of the disclosure. Referring to FIG. 23, in a single pixel PX (e.g., PX1), there may be two or more, e.g., three first electrode branches 210B_6 and two electrode branches 220B_6. First electrode branches 210B_6 may extend from a first electrode stem 210S_6 and form therewith first electrode 210_6. Second electrode branches 220B_6 may extend from a first electrode stem 220S_6 and form therewith first electrode 220_6. A second insulating layer 520_6 may be disposed to cover at least a side portion of each of the electrode branches 210B_6 and 220B_6. It is to be noted that, on the first electrode branches 210B_6 disposed at the outermost positions with respect to the center of the pixel PX, the second insulating layer 520_6 may be disposed only on one side portion of each of the first electrode branches 210B_6 where the light-emitting elements 300 may be aligned. On the other hand, on the first electrode branches 210B_6 disposed on the inner side with respect to the center of the pixel PX and the second electrode branches 220B_6, the second insulating layer 520_6 may be disposed on both side portions.

In the example shown in FIG. 23, the second insulating layer 520_6 may be extended in the second direction D2 parallel to the direction in which the first electrode branches 210B_6 and the second electrode branches 220B_6 may be extended, and patterns of a second insulating layer 520_6 may be spaced apart from one another in the first direction DR1. It is, however, to be understood that the disclosure is not limited thereto. As described above with reference to the other drawings, the second insulating layer 520_6 may also be disposed in the space between the electrode branches 210B_6 and 220B_6 spaced apart from each other, so that the patterns of the second insulating layer 520_6 may be partially connected.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
a first electrode and a second electrode spaced apart from the first electrode;
a light-emitting element disposed on the first electrode and the second electrode; and
an insulating layer disposed to overlapping with at least portion of the light emitting elements, wherein at least a portion of an outer surface of the light-emitting element is chemically bonded to the insulating layer.

2. The display device of claim 1, wherein the light-emitting element is disposed on the insulating layer.

3. The display device of claim 1, wherein
the light-emitting element is brought into contact with the insulating layer to form the chemical bond, and
an area where the light-emitting element and the insulating layer are in contact with each other comprises a covalent bond area containing the chemical bond between the light-emitting element and the insulating layer.

4. The display device of claim 3, wherein
the light-emitting element comprises:
a rod-like semiconductor core;
an insulation film surrounding the semiconductor core; and
a binding group coupled to the insulation film,
the insulating layer comprises a second functional group, and
the chemical bond between the light-emitting element and the insulating layer is formed by a chemical reaction between the bonding group and the second functional group.

5. The display device of claim 4, wherein
the binding group comprises:
a main chain;
a linker coupled to the main chain and connecting the main chain with the light-emitting element; and
a first functional group substituted on the main chain, and
the first functional group forms a covalent bond with the second functional group.

6. The display device of claim 5, wherein the main chain is selected from a group consisting of a C1-6 alkyl group, a C2-6 alkenyl group, a C2-6 alkynyl group, a phenyl group, a biphenyl group, and a naphthalene group.

7. The display device of claim 5, wherein
the linker is selected from a group consisting of —Si(OH)3, —Si(OR)3, —(R)Si(OH)3, —(R)Si(OR)3, —B(OH)2, —B(OR)2, —(R)B(OH)2 and —(R)B(OR)2, and
the R is a carbon chain.

8. The display device of claim 5, wherein the first functional group is selected from a group consisting of alcohol group, an alkylamine group, an acrylate group, and an epoxy group.

9. The display device of claim 1, wherein
the insulating layer comprises one or more insulating patterns extended in a direction, and
the insulating patterns are spaced apart from one another in another direction crossing the direction.

10. The display device of claim 9, wherein the insulating layer comprises:
a first insulating pattern partially overlapping the first electrode; and
a second insulating pattern partially overlapping the second electrode.

11. The display device of claim 10, wherein
the first insulating pattern overlaps with one side portion of the first electrode that faces the second electrode, and
the light-emitting element is disposed on the side portion of the first electrode and one side portion of the second electrode that faces the first electrode.

12. The display device of claim 1, wherein
the insulating layer is extending in a direction, and
the insulating layer overlaps an area between the first electrode and the second electrode, and overlaps at least portion of the first electrode and the second electrode.

13. The display device of claim 1, wherein the insulating layer overlaps a space between the first electrode and the second electrode, but does not overlaps the first electrode and the second electrode.

14. The display device of claim 1, wherein the insulating layer overlaps a center portion of the light-emitting element.

15. The display device of claim 1, further comprising:
a first contact electrode electrically connected to the first electrode and the light emitting element; and
a second contact electrode electrically connected to the second electrode and the light emitting element.

* * * * *